United States Patent
Frankel et al.

(10) Patent No.: US 7,605,556 B2
(45) Date of Patent: Oct. 20, 2009

(54) MICROCONTROLLER METHODS OF IMPROVING RELIABILITY IN DC BRUSHLESS MOTORS AND COOLING FANS

(75) Inventors: Scott Frankel, Gilbert, AZ (US); Eric Hardt, Phoenix, AZ (US); Nigel D. Strike, Phoenix, AZ (US)

(73) Assignee: Minebea Co., Ltd. (JP)

( * ) Notice: Subject to any disclaimer, the term of this patent is extended or adjusted under 35 U.S.C. 154(b) by 73 days.

(21) Appl. No.: 11/743,985

(22) Filed: May 3, 2007

(65) Prior Publication Data
US 2007/0285042 A1    Dec. 13, 2007

Related U.S. Application Data

(62) Division of application No. 11/021,385, filed on Dec. 23, 2004, now Pat. No. 7,305,316.

(51) Int. Cl.
H02P 6/16 (2006.01)
(52) U.S. Cl. ............... 318/400.07; 318/811; 318/599
(58) Field of Classification Search ............... 318/599, 318/811, 432, 400.07
See application file for complete search history.

(56) References Cited

U.S. PATENT DOCUMENTS

| | | | |
|---|---|---|---|
| 4,744,005 A | | 5/1988 | Milani |
| 5,019,757 A | * | 5/1991 | Beifus ............... 318/400.07 |
| 5,159,218 A | * | 10/1992 | Murry et al. ............... 310/68 B |
| 5,447,414 A | * | 9/1995 | Nordby et al. ............... 417/20 |
| 5,546,272 A | | 8/1996 | Moss et al. |
| 5,554,913 A | * | 9/1996 | Ohsawa ............... 318/434 |
| 5,621,159 A | | 4/1997 | Brown et al. |
| 5,727,928 A | | 3/1998 | Brown |
| 5,926,386 A | | 7/1999 | Ott et al. |
| 6,134,667 A | | 10/2000 | Suzuki et al. |
| 6,172,611 B1 | | 1/2001 | Hussain et al. |
| 6,194,858 B1 | | 2/2001 | Chen |
| 6,414,843 B1 | | 7/2002 | Takeda |
| 6,487,668 B2 | | 11/2002 | Thomas et al. |
| 6,643,128 B2 | | 11/2003 | Chu et al. |
| 6,647,320 B1 | | 11/2003 | Inoue |
| 6,725,132 B2 | | 4/2004 | Frankel et al. |
| 6,735,499 B2 | | 5/2004 | Ohki et al. |
| 6,876,165 B1 | | 4/2005 | Rappenecker et al. |
| 7,075,261 B2 | | 7/2006 | Burstein |
| 7,305,316 B2 | | 12/2007 | Frankel et al. |

(Continued)

OTHER PUBLICATIONS

U.S. Appl. No. 11/744,132 Office Action dated Jan. 3, 2003, 8 pages total.

(Continued)

*Primary Examiner*—Rina I Duda
(74) *Attorney, Agent, or Firm*—Townsend and Townsend and Crew LLP

(57) ABSTRACT

A method of controlling a motor speed for a fan assembly includes receiving a duty cycle value at a microcontroller. The microcontroller receives a measured fan speed from a speed sensor. An expected fan speed is determined, where the expected fan speed corresponds to the duty cycle value. The measured fan speed is compared with the expected fan speed. A duty cycle of a motor driving signal is reduced if the measured fan speed is less than a predetermined fraction of the expected fan speed.

9 Claims, 17 Drawing Sheets

U.S. PATENT DOCUMENTS

| | | |
|---|---|---|
| 7,310,049 B2 | 12/2007 | Bowman |
| 2001/0042616 A1 | 11/2001 | Baer |
| 2002/0140389 A1 | 10/2002 | Ohki et al. |
| 2002/0154131 A1 | 10/2002 | Cheu |
| 2002/0196606 A1 | 12/2002 | Hirao et al. |
| 2003/0234630 A1 | 12/2003 | Blake |
| 2004/0070932 A1 | 4/2004 | Dobbs et al. |
| 2004/0150949 A1 | 8/2004 | Belady et al. |
| 2005/0078451 A1 | 4/2005 | Sauciuc et al. |
| 2005/0275365 A1 | 12/2005 | Currie et al. |
| 2006/0061480 A1 | 3/2006 | Bowman |
| 2007/0076372 A1 | 4/2007 | Lin |
| 2007/0219756 A1 | 9/2007 | Frankel et al. |

OTHER PUBLICATIONS

Office Action of U.S. Appl. No. 11/744,132 dated Dec. 10, 2008, 9 pages total.

Office Action of U.S. Appl. No. 11/744,132 dated Jun. 9, 2008, 11 pages total.

International Search Report and Written Opinion of PCT Application No. PCT/US2005/046087, mailed Jan. 31, 2008, 12 pages total.

* cited by examiner

FIG. 6

MICROCONTROLLER METHODS OF IMPROVING RELIABILITY IN DC BRUSHLESS MOTORS AND COOLING FANS

BACKGROUND OF THE INVENTION

1. Technical Field

The present invention relates to cooling fans. More particularly, the present invention relates to intelligent cooling fans for use in electronic systems and for designing cooling solutions for electronic systems.

2. Discussion of the Related Art

In electronic systems, such as computer systems, cooling fans play an important role in maintaining their operational capabilities. The inability to remove excessive heat from electronic systems may lead to permanent damage of the system. Because of the complexity of existing electronic systems, cooling fans having added functionalities other than just providing cooling air, such as the ability to control the speed of a fan, the ability to monitor a tachometer pulse on a fan to determine instantaneous fan speed, and the ability to detect if a fan has failed or is slower than its preset speed, are required. Although these functionalities exist in some cooling fans today, there is no standard design or protocol that is available to control cooling fans produced by different manufacturers. Moreover, in order to implement these cooling fans within a system, specialized printed circuit assemblies (PCAs), also called controller cards, are required to be designed so as to provide signals that a fan can understand and also to receive and provide signals to the system in a form that is interpretable by the electronics of the system.

If one desires additional functionality, such as the ability for the fans to compensate for other failed fans by increasing in speed, the ability for fans to notify external hardware that there is a problem, or the ability for fans to increase speed in response to increased system temperatures, a specialized PCA or controller card is also required. The PCA or controller card is designed and built to be capable of detecting a fan failure, notifying the system that a fan has failed, and adjusting the speeds of the other fans in the system. The design and manufacture of PCAs and controller cards involve a great deal of engineering time and resources, which ultimately add to the cost of the overall system utilizing the cooling fan(s).

Designing cooling solutions for new systems is also a time-consuming process for the thermal design engineer. Typically, the PCA or controller card is required to be designed and built for controlling the fan speed and other functionality, such as failure detection and alarm settings. Often times, the design and construction of multiple control cards are required so as to test them in real world applications to obtain the right combination of fans, fan speeds, alarm settings, etc. The multiple iterations of installing sample fans in a system, determining the adequate fan speeds and power required, and testing the fans in the system, for example, are costly and inefficient.

Another concern involving conventional cooling fans, and in particular, direct current (DC) brushless cooling fans, is that they change speeds depending on the applied input voltage. As the input voltage is increased, the fans speed up and use more power. When input voltage is decreased, the fans decrease in speed and provide less cooling. Many typical applications have a voltage range that may vary between 24 to 74 volts. Accordingly, a system designer is charged with maintaining a constant cooling during these wide voltage swings. Accordingly, a voltage regulating power supply is usually installed in a system to keep the voltage to the fans constant. However, having to install a voltage regulating power supply adds additional complexity and cost to the overall system as well.

BRIEF DESCRIPTION OF THE DRAWINGS

FIG. 6 illustrates a sample screen of advanced functions of a fan controller user interface according to an embodiment of the present invention;

DETAILED DESCRIPTION

Figure 1:
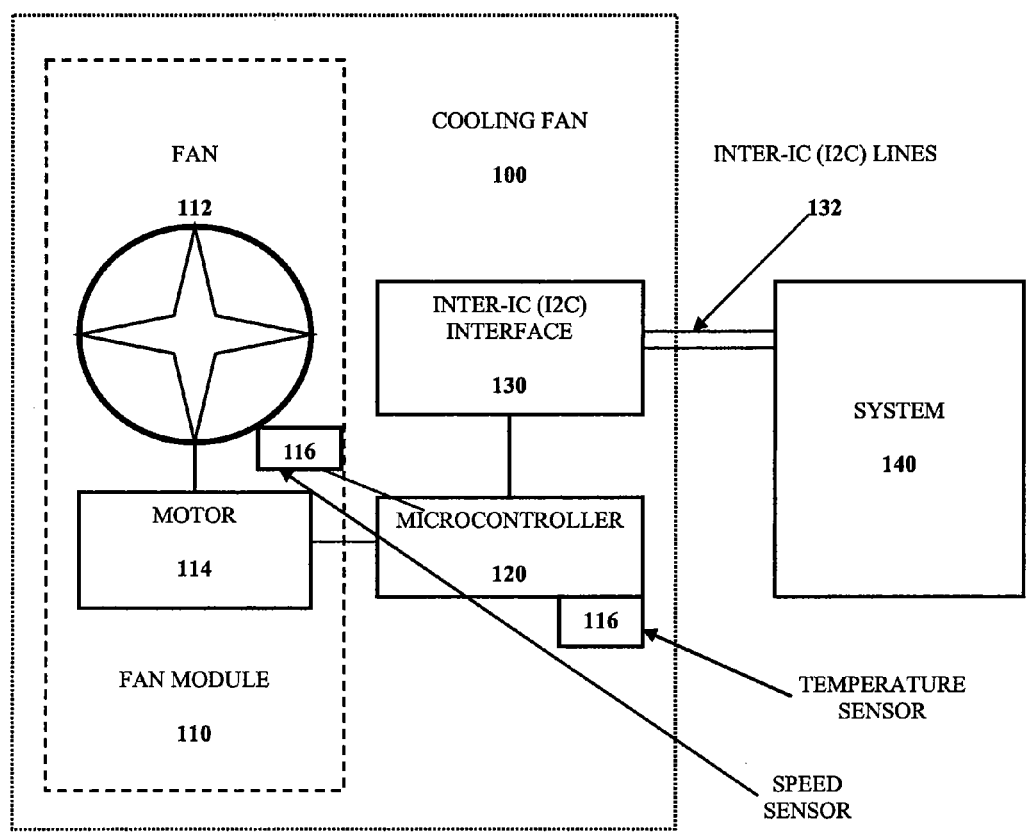
FIG. 1 illustrates a cooling fan solution according to an embodiment of the present invention.

FIG. 1 illustrates a cooling fan solution according to an embodiment of the present invention. The cooling fan 100 includes a fan module 110, which has a fan 112 (including fan blades) and a motor 114 rotatably coupled to the fan 112 to drive the fan 112. A microcontroller 120, such as an 18-pin PIC16C717 microcontroller device manufactured by Microchip Technology, Inc., is in direct communication with the fan module 110, and specifically, the motor 114. Any suitable microcontroller or processor may be utilized, though. The microcontroller 120 is preferably fixed internally within the cooling fan 100.

A bus interface, such as the Inter-IC (I2C) ("I2C-Bus Specification", Version 2.1, January 2000, from Philips Semiconductors) bus interface 130 is in communication with the microcontroller 120. The bus interface 130 facilitates transfer of data to and from the microcontroller 120. The bus interface 130 may be interconnected by bus lines 132, such as I2C bus lines, to a system 140. The I2C bus lines 132 has two lines: a data (SDA) line and a clock (SCL) line. Inter-IC (I2C) may be accessed serially so that each individual device utilizing the I2C protocol has a specific identification (ID), but may all be connected to the same communication line(s) or bus(es) (i.e., it may be connected as a parallel bus). Inter-IC (I2C) is a useful protocol because it is familiar to thermal design engineers who utilize cooling fans in their system designs, and a fair number of digital logic devices utilize the I2C protocol. However, any other bus interface systems and protocols may also be utilized. For example, the Controller-Area Network (CAN) protocol (Controller-Area Network (CAN) Specification, version 2.0, 1991, Robert Bosch GmbH, Stuttgart, Germany), utilized in the automotive industry, may also be utilized with the bus interface 130 according to an embodiment of the present invention.

Besides the ability for a fan customer or thermal design engineer to control the fan speed, monitor a tachometer pulse on the fan to determine instantaneous fan speed, and detect if the fan has failed or is slower than a preset speed, additional functionality, such as the ability to electronically read the part number of a cooling fan 100, the ability to electronically determine the fan manufacturer, and the ability to electronically read the manufacturing date, is particularly desirable. Because of the concern that various fan manufacturers may have different methods of controlling fan speed, or providing alarm or tachometer signals, being able to easily obtain cooling fan 100 information such as the part number, the fan manufacturer, and the manufacturing date quickly aids in the design and repair of a cooling solution.

According to an embodiment of the present invention, the microcontroller 120 is programmed with program code that enables the microcontroller 120 to read byte communications provided by a system or device 140 that utilizes, for example, the I2C protocol. In a particular embodiment of the present invention, the microcontroller 120 includes a program memory into which the program code is stored. The PIC16C717 microcontroller, for example, is capable of handling 14-bit words and has a capacity of 2 kilobytes. The program or instruction code is programmed only once into the microcontroller 120 at the factory, and it is not re-programmable or re-writeable by an end user or cooling fan customer. The PIC16C717 microcontroller, for example, also includes a small data memory, or "scratch pad memory", having a capacity of 256 bytes available to the microcontroller 120 to conduct its operations. The data memory of the microcontroller 120 is volatile and does not store any programming or instructions, but rather it is only a working memory.

The program code (such as code written in the "C" programming language) in the microcontroller 120 may include the cooling fan's 100 part number, manufacturer, and date of manufacture so that when the microcontroller 120 receives a command, e.g., from the host system/device 140, to output such data to a system or device 140 connected thereto, the microcontroller 120 may readily output the requested data. Useful data other than the cooling fan's 100 part number, manufacturer, and date of manufacture, such as the current (Amps) draw of the fan, may be included as well. The microcontroller 120 may communicate data regarding the cooling fan 100 in, for example, the I2C protocol. By providing a cooling fan 100 that is capable of directly communicating with a system or device 140 utilizing a common protocol, such as the I2C protocol, PCAs or controller cards are not required at all to control or communicate with the cooling fan 100.

Figure 2:
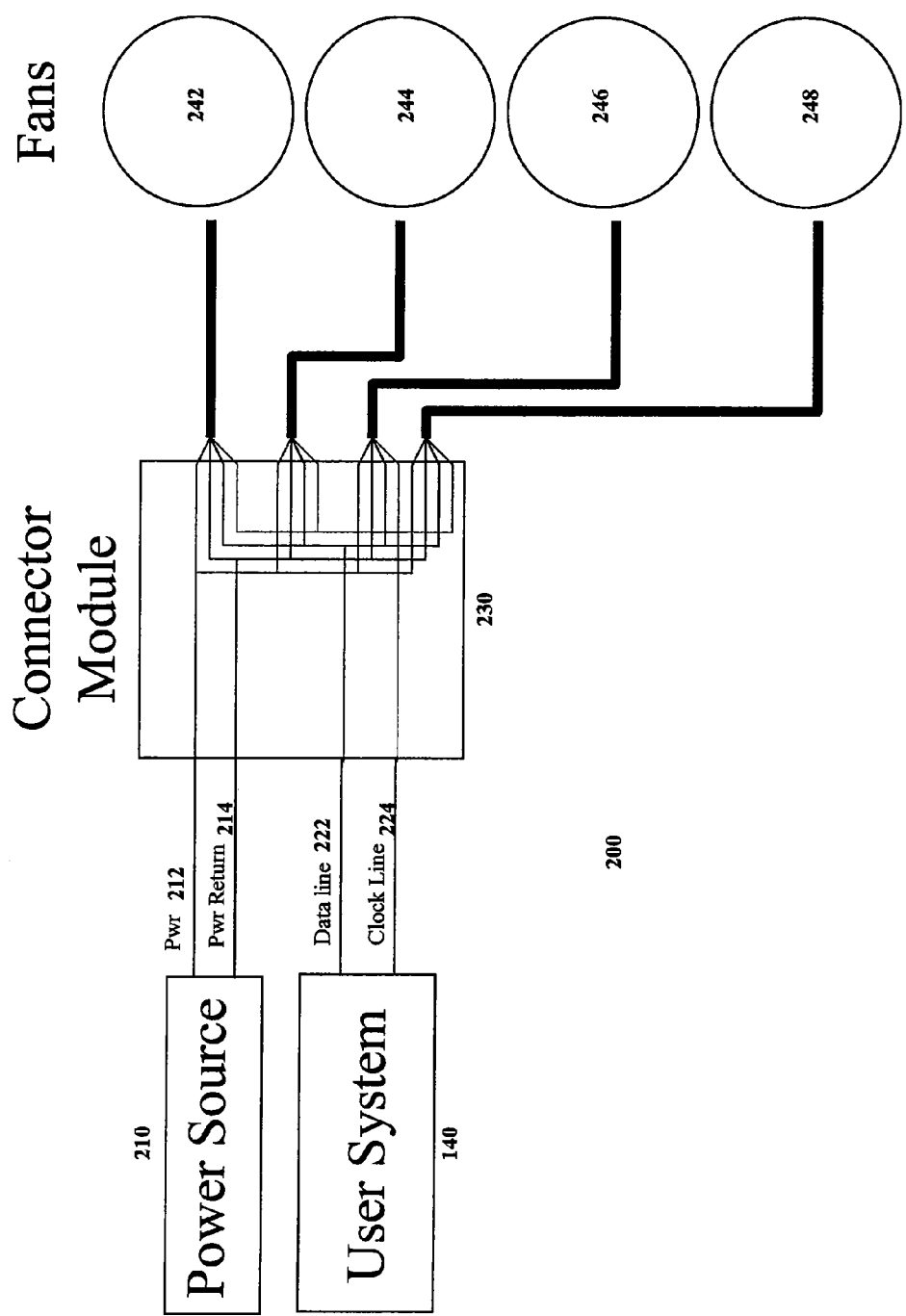
FIG. 2 illustrates an electronic system implementing a plurality of cooling fans according to an embodiment of the present invention.

FIG. 2 illustrates an electronic system implementing a plurality of cooling fans according to an embodiment of the present invention. A plurality of cooling fans 242, 244, 246, 248 are provided within the electronic system 200. Each of the plurality of cooling fans 242, 244, 246, 248 are electrically connected to a connector module 230, which is a line splitter for a power source 210 and a user system/device 140. According to an embodiment of the present invention, the electronic system 200 utilizes the I2C protocol, and the user system/device 140 has communication lines according to the I2C protocol, a data line 222 and a clock line 224 connected to the connector module 230. The connector module 230 in turn splits the data line 222 and the clock line 224 to each one of the plurality of cooling fans 242, 244, 246, 248. Similarly, the power source lines, power line 212 and power return line 214, from the power source 210 are connected to the connector module 230, which in turn splits the power line 212 and the power return line 214 to each one of the plurality of cooling fans 242, 244, 246, 248.

Specific addresses required in all I2C devices may be set externally (by connecting address lines high for a "1", or low for a "0"), or internally during production. The data line 222 and the clock line 224 for each one of the plurality of cooling fans 242, 244, 246, 248 and the user system/device 140 may be connected to each other, or to an internal bus, which enables the user system/device 140, for example, to change the fan speeds of any one of the plurality of cooling fans 242, 244, 246, 248, to detect the fan speeds of any one the plurality of cooling fans 242, 244, 246, 248, to read the part number of any one the plurality of cooling fans 242, 244, 246, 248, etc.

According to another embodiment of the present invention, the microcontroller 120 may be programmed with a program code to enable each cooling fan 100 to detect failures of other cooling fans 242, 244, 246, 248 to notify a user system/device 140 that a fan has failed, or to adjust the speeds of the other fans in the system to compensate. In the prior art, a specialized PCA or controller card was required to be designed and built to provide these functionalities for an electronic system 200 utilizing cooling fans 242, 244, 246, 248. Accordingly, the microcontroller 120 may be programmed with program code so that each cooling fan 242, 244, 246, 248 has the ability to detect and compensate for other failed fans by increasing its fan speed, to notify external hardware 140 that there is a problem, or to increase its fan speed in response to increased system temperatures. By having each of the plurality of cooling fans 242, 244, 246, 248 in communication with each other, added redundancy and functionality may be provided to the overall system 200.

In one particular embodiment, the cooling fans 242, 244, 246, 248 are connected to each other by their communication lines 132 (see FIG. 1), which may be facilitated by a connection to a shared bus. If one of the cooling fans 242, 244, 246, 248 fails, then the failure is detected by the other cooling fans 242, 244, 246, 248. Upon this failure detection, the other cooling fans 242, 244, 246, 248 may be programmed to increase the fan speed to compensate for the decreased airflow due to the failure of one of the cooling fans 242, 244, 246, 248. In a further embodiment, temperature sensors may be implemented utilizing the I2C protocol and connected to the plurality of cooling fans 242, 244, 246, 248 so that each of the cooling fans 242, 244, 246, 248 may communicate directly with the temperature sensors (or through the host system/device 140 if the temperature sensors are not directly connected to the cooling fans 242, 244, 246, 248). Therefore, the plurality of cooling fans 242, 244, 246, 248 may be further programmed to increase fan speeds if an increase in temperature is detected by the temperature sensors, or decrease the fan speed if the temperature drops. In other words, the cooling fans 242, 244, 246, 248 may also be aware of the temperatures detected by the temperature sensors installed within the system and act accordingly. By connecting the cooling fans 242, 244, 246, 248 to each other and placing them into a "multi-master" mode, each cooling fan 242, 244, 246, 248 is in communication with each other and the redundant and failure recovery operations discussed above may be implemented.

By implementing a microcontroller 120 and a bus interface 130 utilizing a standard protocol, such as the I2C protocol, engineers are freed from designing and building a PCA or controller card, the resulting system is not burdened with the additional cost of the controller card, and the cooling fan 100 may be directly added to the existing bus of the customer or design engineer hardware. The cooling fans 242, 244, 246, 248 (see FIG. 2) may be connected to each other, or to a commonly connected printed circuit board (PCB), to greatly simplify cooling solution design and construction. Moreover, the savings of not requiring a specialized PCA or controller card are significant, as they may run three times the cost of the cooling fan itself. In one particular embodiment, the cooling fans 242, 244, 246, 248 may be compatible with, for example, the IBM Specification 18P3640 (October 2001) Type 5 fans.

According to yet another embodiment of the present invention, a cooling fan 100 (see FIG. 1) is provided that is capable of operating at a constant speed even with changing/varying input voltage and/or motor load. As mentioned above, the majority of conventional DC brushless cooling fans change speeds with applied input voltage. As the input voltage is increased, the fans speed up and use more power. When input voltage is decreased, the fans decrease in speed and provide less cooling. Many existing applications have a voltage range that can vary from 24 to 74 volts. The design engineer is charged with maintaining a constant cooling for the system during these wide voltage swings. Typically, the design engineer installs a voltage regulating power supply in the system to keep the voltage to the fans constant. However, providing a voltage regulating power supply adds more complexity and increases the cost to the overall system.

Figure 3A:
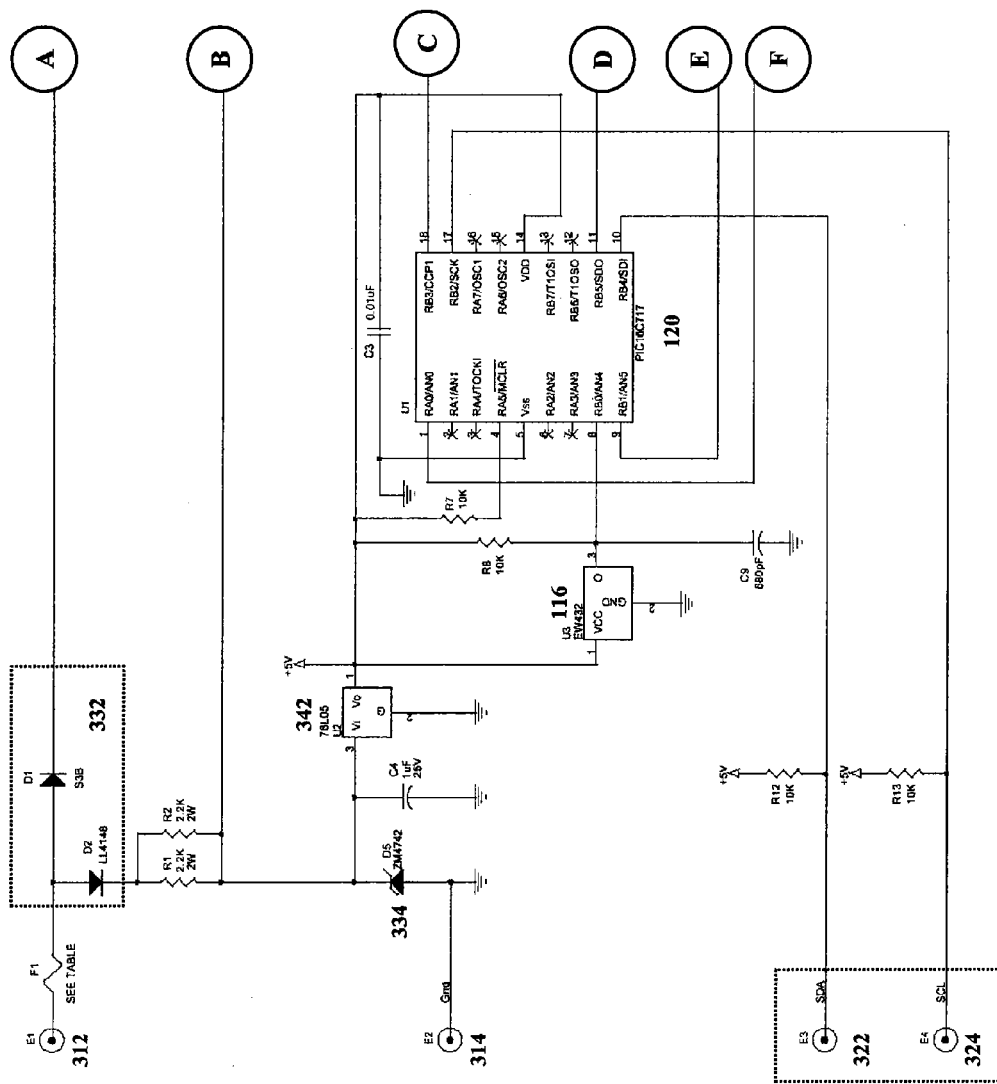
FIGS. 3A and 3B illustrate a schematic circuit diagram for a cooling fan according to an embodiment of the present invention.
Figure 3B:
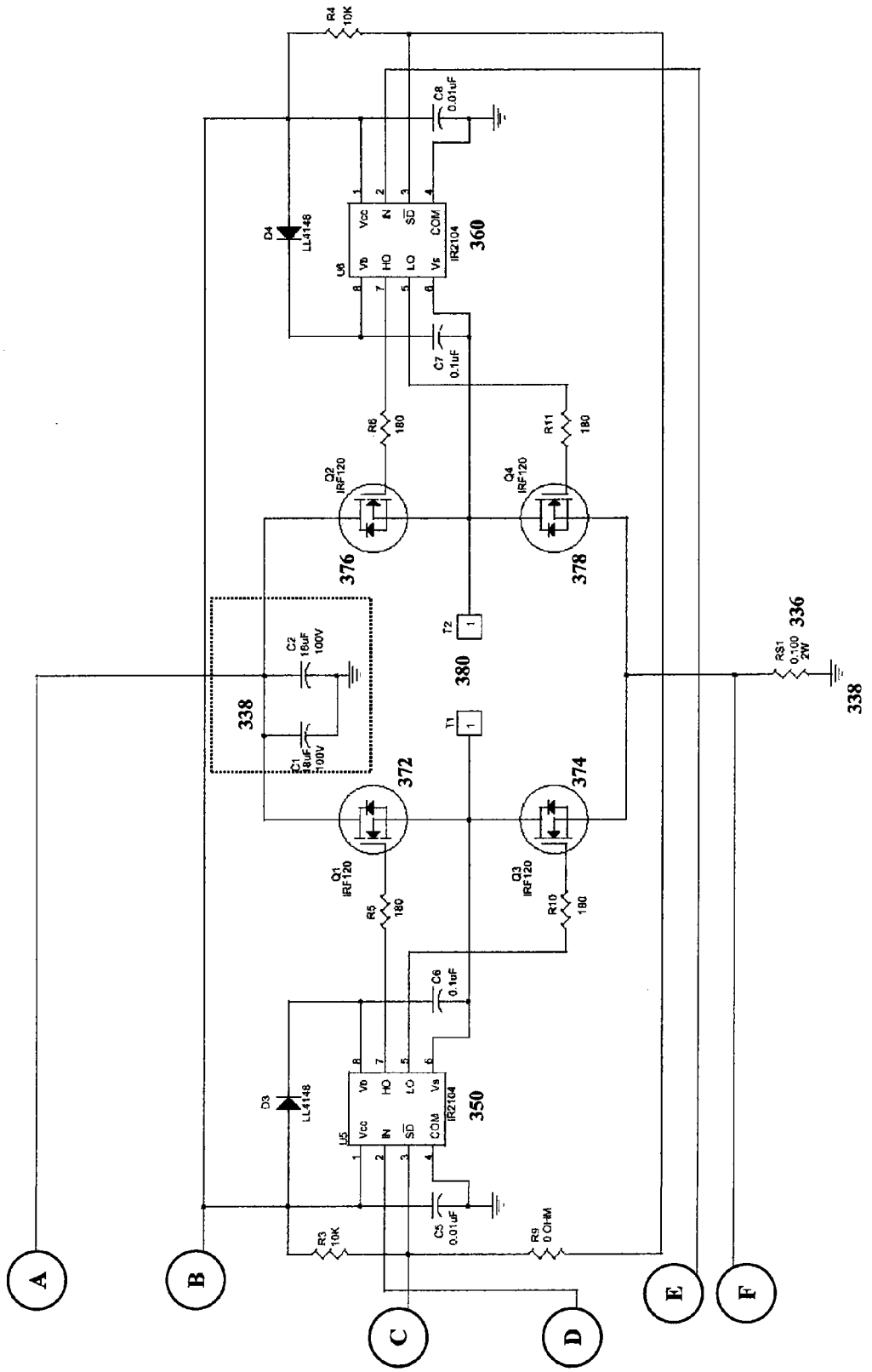

FIGS. 3A and 3B illustrate a schematic circuit diagram for a cooling fan according to an embodiment of the present invention. In an embodiment according to the present invention, the microcontroller 120 has program code having instructions to detect the speed of the cooling fan 100 in real time and maintain that speed, regardless of changes in the input voltage. Referring to FIG. 3A, line E1 312 is the voltage (in) line, while line E2 314 is the voltage return (ground). In a preferred embodiment of the present invention, lines 322 and 324 are Inter-IC (I2C) lines: line 322 being the data line and line 324 being the clock line for communication utilizing the I2C protocol. Typically, in cooling fan applications, the input voltage may be 12 volts, 24 volts, or 48 volts. Diodes D1 and D2 332 provide for reverse polarity protection within the system. Zenor diode D5 334 provides a drop in power and regulates the voltage to, for example, 12 volts. A 5V regulator 342 is included to provide regulated 5 volts to the microcontroller 120 and the speed sensor 116 (e.g., the Hall sensor). The Hall sensor 116 provides a digital signal to the microcontroller 120 based on the positions of the stator 380 of the fan motor 114 utilizing the Hall effect, which occurs when the charge carriers moving through a material experience a deflection because of an applied magnetic field. This deflection results in a measurable potential difference across the side of the material which is transverse to the magnetic field and the current direction. According to one embodiment, the Hall sensor 116 provides a 50% duty cycle signal, that is, two pulses for each revolution/cycle of the fan. Based on the signals provided by the Hall sensor 116, the microcontroller 120 is capable of determining the speed of the cooling fan 100 and making any adjustments necessary to maintain a constant fan speed.

Referring to FIG. 3B, the microcontroller 120 is connected to two metal-oxide semiconductor field effect transistor (MOSFET) drivers 350, 360. Through the MOSFET drivers 350, 360, the microcontroller 120 controls the duty cycle (on time vs. off time) of the voltage provided to the fan motor 114, and more specifically, to the MOSFETs 372, 374, 376, 378 and across the stator 380. According to an embodiment of the present invention, the drains of MOSFETs 372, 376 are coupled to the variable input voltage (from line E1 312). The gate of MOSFET 372 is coupled to the high (H0) line (7) of MOSFET driver 350. The gate of MOSFET 376 is also coupled to the high (H0) line (7) of MOSFET driver 360. The logic on pin 2, input from the microcontroller 120, of each MOSFET driver 350, 360 are controlled by different lines, lines D and E, respectively. The state of pin 2 is the same as the H0 pin of each MOSFET driver 350, 360, and the microcontroller 120 alternates these signals so that MOSFETs 372, 376 are not in the "high" state at the same time.

The sources of MOSFETs 372, 376 are each coupled to a node to which the drains of each of MOSFETs 374, 378 are respectively coupled, and to which the stator 380 is coupled. The gate of MOSFET 374 is coupled to the low output (L0) line (5) of MOSFET driver 350. The gate of MOSFET 378 is also coupled to the low output (L0) line (5) of MOSFET driver 360. The sources of each of MOSFETs 374, 378 are coupled to a reference voltage or ground 338. In the configuration illustrated in FIG. 3B, MOSFETs 372, 378 are "on" at the same time while MOSFETs 374, 376 are "off", and alternatively, when MOSFETs 374, 376 are "on", MOSFETs 372, 378 are "off".

Accordingly, when an increasing speed is detected via the Hall sensor 116, the microcontroller 120 reduces the stator duty cycle to maintain the same energy transfer to the motor windings. The shifts in duty cycle are implemented in program code embedded within the microcontroller 120. Resistor 336 provides a locked rotor detection signal for the microcontroller 120. The microcontroller 120 detects the current flowing through the windings by monitoring the voltage representation of the current that appears on resistor 336. If this voltage exceeds a set threshold set internal to the microcontroller 120, then the output pulses are terminated and a locked rotor condition is perceived. The capacitors C1 and C2 338 provide for voltage ripple filtering and as additional protection to limit high switching currents from causing noise in the user's system.

Figure 4A:
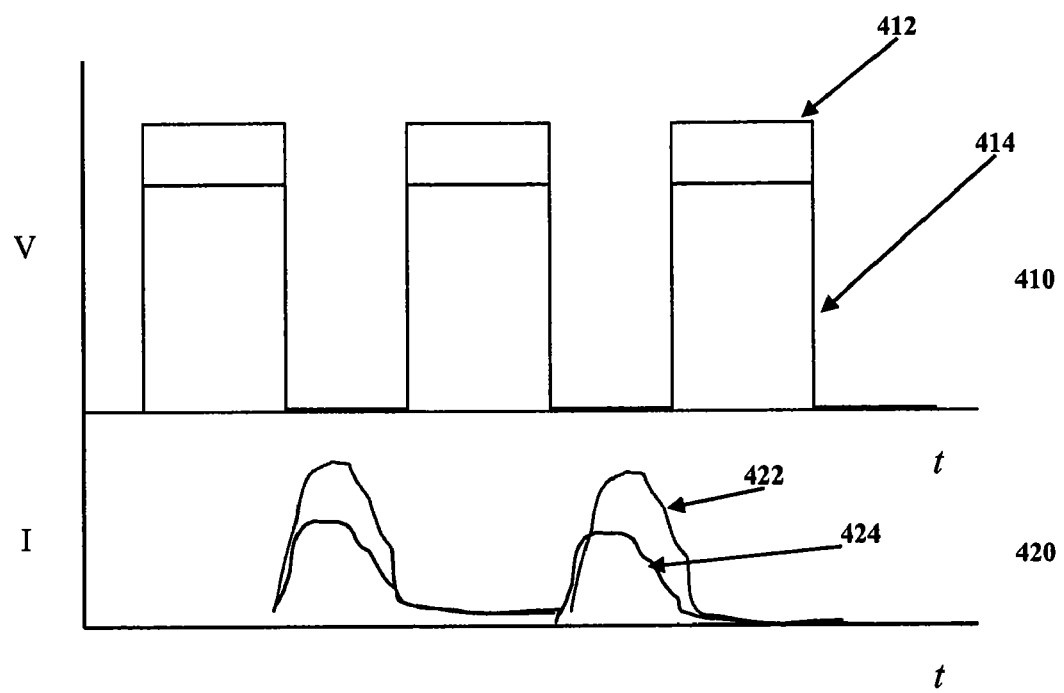
FIG. 4A illustrates voltage and current waveforms according to the prior art.

FIG. 4A illustrates voltage and current waveforms according to the prior art. For example, the nominal voltage for a cooling fan is 48 Vdc. If the voltage is increased to 60 Vdc, for example, the fan has a physical tendency to increase in speed as a reaction to more voltage and energy being switched by the MOSFETs 372, 374, 376, 378 (see FIG. 3B). The top waveform set 410 represents the voltage across a stator 380 with waveform 414 representing 48 volts and waveform 412 representing 60 volts. The bottom waveform set 420 represents the current through the stator 380 with waveform 424 representing a 48 volt input and waveform 422 representing a 60 volt input. Accordingly, without taking any additional measures, the increased voltage and current causes additional energy to be transferred to the coils, which results in a faster spinning fan.

Rather that utilizing a voltage regulating power supply as in the prior art, according to an embodiment of the present invention, the microcontroller 120 of the cooling fan 100 monitors the speed sensor 116, such as a Hall sensor, to detect an increasing speed. Alternatively, the back electromagnetic field (EMF) generated by an increase in speed of the cooling fan 100 may be monitored to detect the increase in speed as well. To compensate for the increasing speed, the microcontroller 120 has program code having instructions to reduce the stator duty cycle (i.e., the on-time vs. the off-time) to maintain the same energy transfer to the motor 114 when an increase in speed is detected. Preferably, the fan speed is controlled utilizing Pulse Width Modulation (PWM), i.e., driving the fan motor 114 using short pulses (the pulses vary in duration to change the speed of the motor—the longer the pulses, the faster the motor turns, and vice versa).

Figure 4B:
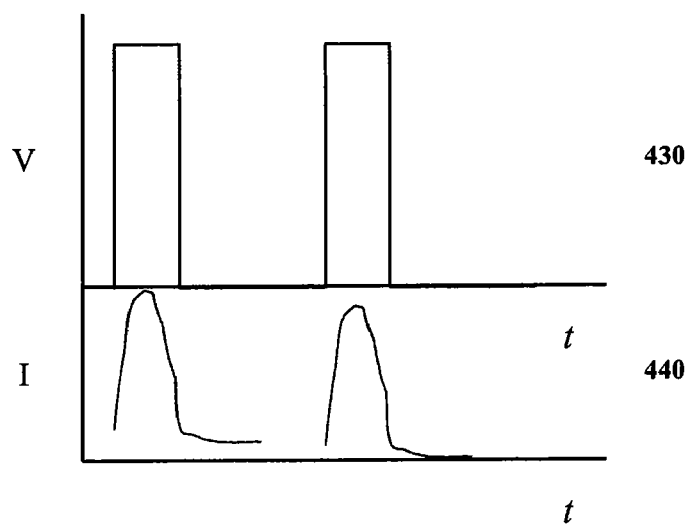
FIG. 4B illustrates a voltage waveform and a current waveform according to an embodiment of the present invention.

FIG. 4B illustrates a voltage waveform and a current waveform according to an embodiment of the present invention. The top waveform 430 represents a reduced stator duty cycle (on-time vs. off-time) of the voltage (e.g., 60 Vdc) as compared to waveform 412 in FIG. 3A. The bottom waveform 440 represents a reduced stator duty cycle of the current as compared to waveform 424 in FIG. 3A. Accordingly, while the voltage and current has increased, the "time-on" of each has been decreased to maintain the same energy transfer to the motor 114, and thereby regulate the fan speed. In one embodiment of the present invention, shifts in the stator duty cycle based on the various voltage levels are preprogrammed in the program code embedded within the microcontroller 120.

Figure 4C:
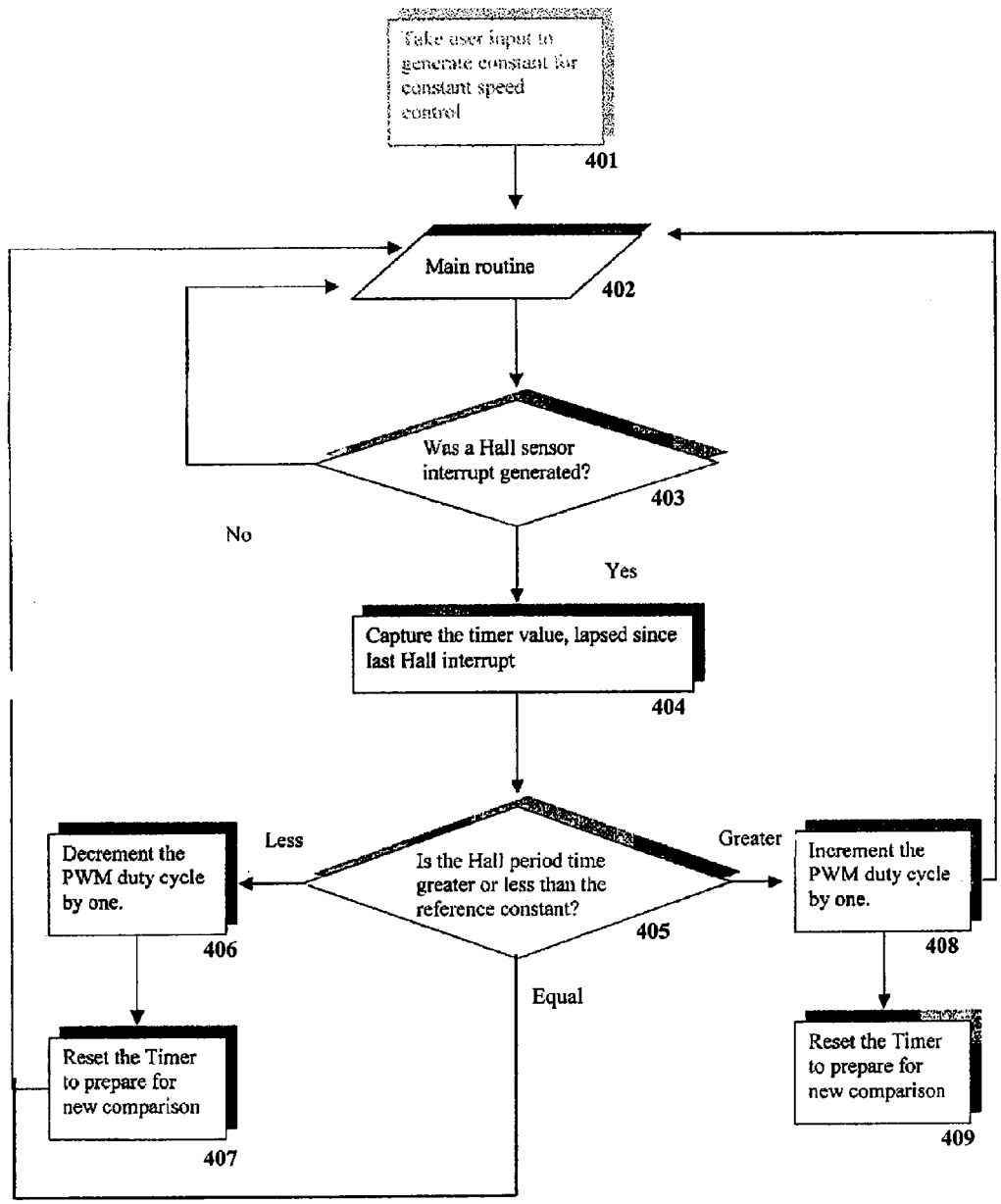
FIG. 4C illustrates a flow chart diagram of a logic path for a microcontroller to maintain a speed of a cooling fan according to an embodiment of the present invention.

FIG. 4C illustrates a flow chart diagram of a logic path for a microcontroller to maintain a speed of a cooling fan according to an embodiment of the present invention. A reference constant is provided 401 (programmed into the microcontroller 120) corresponding to the constant speed at which the cooling fan 100 is to be maintained. The microcontroller 120 enters a main routine 402 for its normal operation. The program code embedded within the microcontroller 120 determines whether a speed sensor interrupt, such as a Hall sensor interrupt signal, was generated 403. If such an interrupt was not generated, then the operation flows back to block 402. If an interrupt was generated, then a timer value lapsed since the occurrence of the last interrupt signal is captured 404. It is determined 405 whether the timer value is greater or less than the reference constant, which represents the desired fan speed. If the timer value is less than the reference constant, then the duty cycle (such as the PWM duty cycle) is decremented 406 by one clock, the timer is reset 407 for a new comparison, and operation flows back to block 402. If the timer value is greater than the reference constant, then the duty cycle (such as the PWM duty cycle) is incremented 408 by one, the timer is reset 409 for a new comparison, and operation flows back to block 402. If the timer value is equal to the reference constant, then the operation flows back to block 402.

By utilizing the cooling fan 100 according to an embodiment of the present invention, the thermal design engineer does not need to design and build a specialized power supply or other additional circuitry in a PCA, controller card, or in the fan tray in order to compensate for the negative effects on cooling due to swings of the system voltage. Moreover, specialized power supplies can easily cost three times that of the fan itself. The cooling fan 100 according to an embodiment of the present invention provides a constant fan speed regardless of the input voltage, and design time and costs are significantly reduced.

Figure 5:
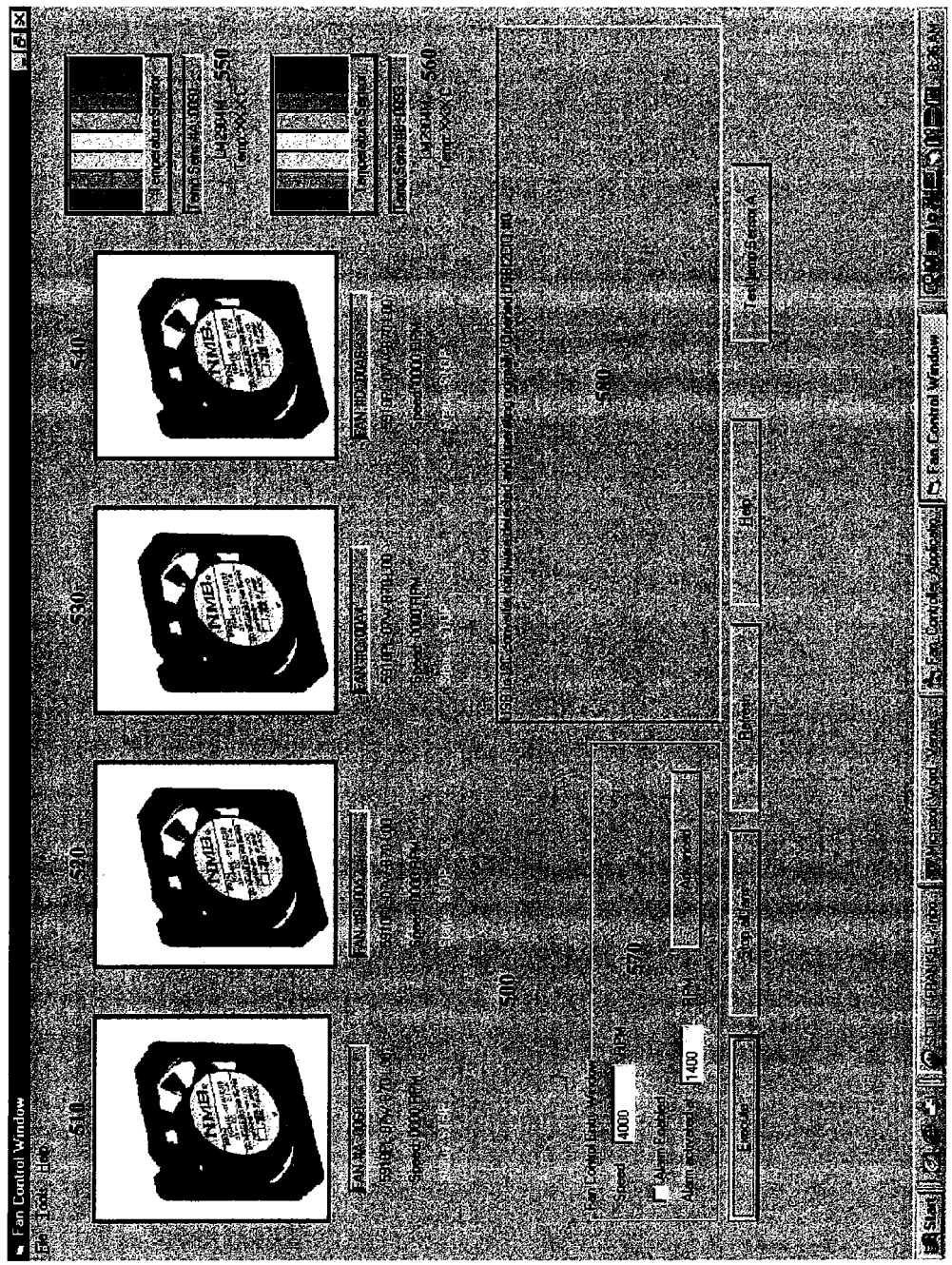
FIG. 5 illustrates a sample screen of a fan controller user interface according to an embodiment of the present invention.

FIG. 5 illustrates a sample screen of a fan controller user interface according to an embodiment of the present invention. The fan controller user interface 500 is preferably a software program executing on a computer system, such as a desktop personal computer (PC) or a laptop computer. The desktop PC or laptop computer may be connected to a network and accessed remotely via, for example, the Internet using Internet Protocol (IP). The fan controller user interface software 500 enables a thermal design engineer to quickly create a cooling solution for a specific application. A typical application of the fan controller user interface software 500 is for designing a cooling solution for a new cabinet/housing for an electronic system.

When designing a cooling solution for a new cabinet/housing, the design engineer does not know: (1) how much airflow is needed; (2) what types of alarms are required; (3) what functions are necessary on the controller card circuitry; and (4) how the system should behave with increasing system temperature. By utilizing the fan controller user interface software 500 according to an embodiment of the present invention, the design engineer may quickly install cooling fans 100 according to embodiments of the present invention and connect these fans to a computer system (e.g., a desktop PC or a laptop computer) executing the fan controller user interface software 500 to determine the cooling solution specifications for a particular cabinet/housing.

The cooling fan(s) 100 are connected to a power source and then to the computer system executing the fan controller user interface software 500. The cooling fan(s) 100 may be connected to a fan/computer adapter, which converts the communications protocol utilized by the cooling fan(s) 100, such as the I2C protocol, to one recognizable by the computer system, such as the Universal Serial Bus (USB) protocol. The fan/computer adapter then plugs into, for example, the USB port on the computer system so that the computer system is in communication with the cooling fan(s) 100.

After assembling the cooling fan(s) 100 into a system cabinet/housing, the design engineer starts the fan controller user interface software 500. As illustrated in the main screen 500 of FIG. 5, the design engineer may change the speed of any cooling fan 510, 520, 530, 540 connected, set basic alarms, monitor the temperature sensor(s) connected, and constantly refresh the data of all of the cooling fan(s) 510, 520, 530, 540 (part number, speed, alarm status, etc.). In one embodiment, the temperature sensor(s) 122 may be incorporated inside the microcontroller 120. The fan controller user interface software 500 emulates the program code resident in a microcontroller 120 to control the behavior of each cooling fan 510, 520, 530, 540. In other words, the fan controller user interface software 500 is adapted to allow a user to control and operate all of the functions of each cooling fan 510, 520, 530, 540. Therefore, all of the functions of each cooling fan 510, 520, 530, 540 are available to the thermal design engineer for design troubleshooting and prototyping.

The main screen shot 500 of FIG. 5 shows basic information for four cooling fans 510, 520, 530, 540, including their part numbers, fan identifications, fan speed, and status (e.g., active, stop, etc.). Basic information for two temperature sensors is also provided, including their sensor identifications, part numbers, and the temperatures detected. Other information may also be provided to the user on the screen. There is provided a fan control entry window 570 that allows a basic speed of the fans 510, 520, 530, 540 to be set, as well as a basic alarm, for example, to be actuated when the fan speed, revolutions per minute (RPM), drops below a certain level. A message box 580 may also be provided to inform the user of events that occur during the use of the fan controller user interface software 500. The fan speeds of a plurality of cooling fans within a system may be set slightly different from each other so as to test for and eliminate any beat frequencies that may occur, which may cause unwanted noise.

Figure 6:
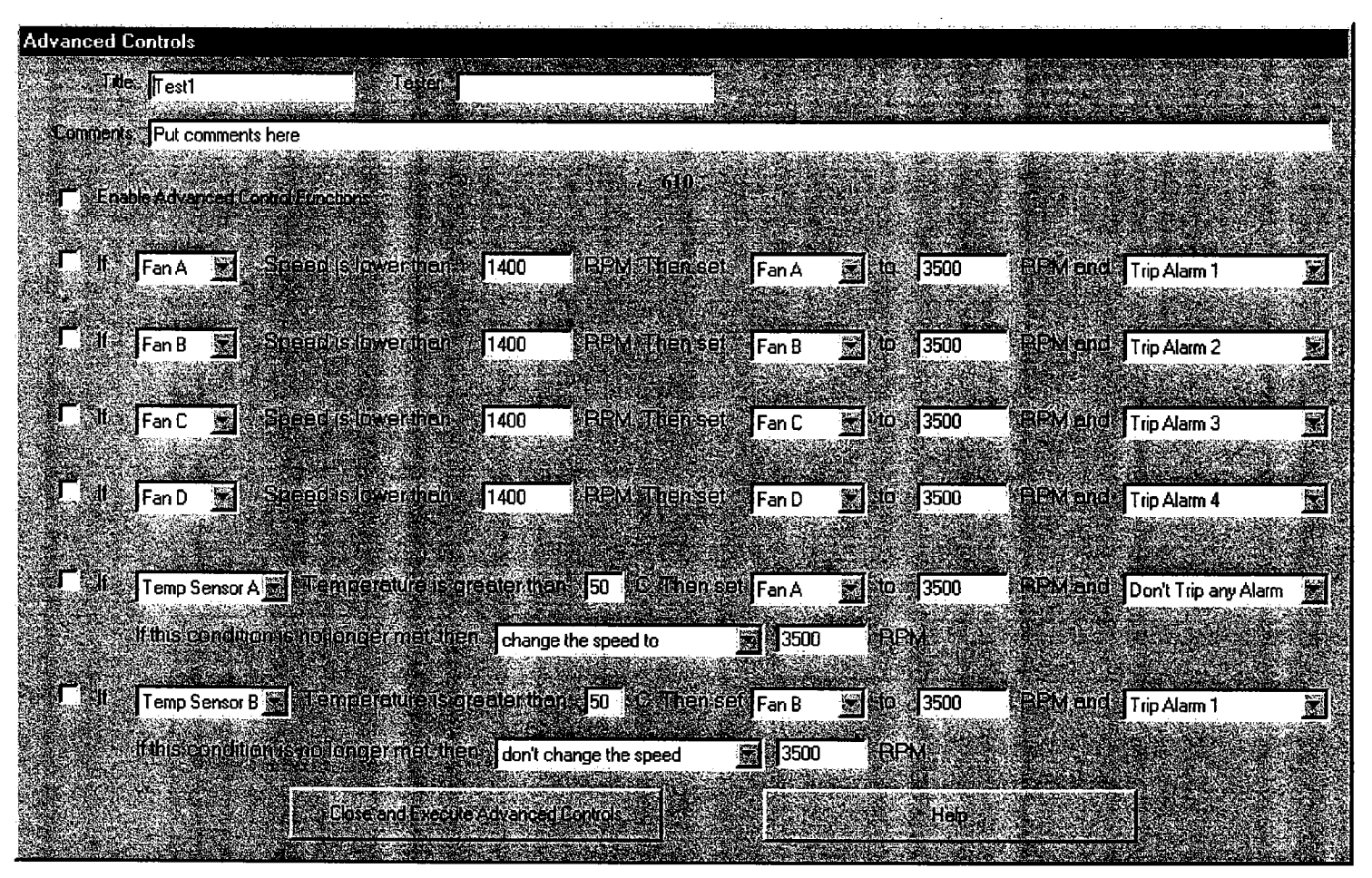

FIG. 6 illustrates a sample screen of advanced functions of a fan controller user interface according to an embodiment of the present invention. In the advanced function screen 610 illustrated in FIG. 6, "what if" conditional scenarios may be set and tested. For example, a scenario may be configured to design an appropriate response to when one of the cooling fans 510, 520, 530, 540 fails. The advanced function screen 610 allows a design engineer to easily conduct such a scenario and program and test for an appropriate response. For example, the following logic condition may be set and tested:

> If FAN A speed is slower than 1500 RPM then set FAN B to 3500 RPM and TRIP ALARM 1.

The fan controller user interface software 500 may be configured so that the commands are in a straightforward sentence-like structure, allowing the user to manipulate the terms from a menu for the bold-underlined terms above to vary a condition. The above example illustrates a sample condition when one cooling fan (Fan A) that is failing is rotating slower than 1500 RPM, a second cooling fan (Fan B) is adjusted to increase in speed (to 3500 RPM) to provide added cooling to the system, and then alarm 1 is tripped, which may be preconfigured to alert the user that there is a problem in the system (or even more specifically, that Fan A is failing). A number of other conditional scenarios may configured using the fan controller user interface software 500 according to an embodiment of the present invention. Moreover, conditional scenarios involving temperature sensors may also be established using a similar methodology. Therefore, the thermal design engineer is able to set and test a variety of different conditions and program the appropriate behavior for each fan 510, 520, 530, 540 to respond accordingly to each condition.

Figure 7:
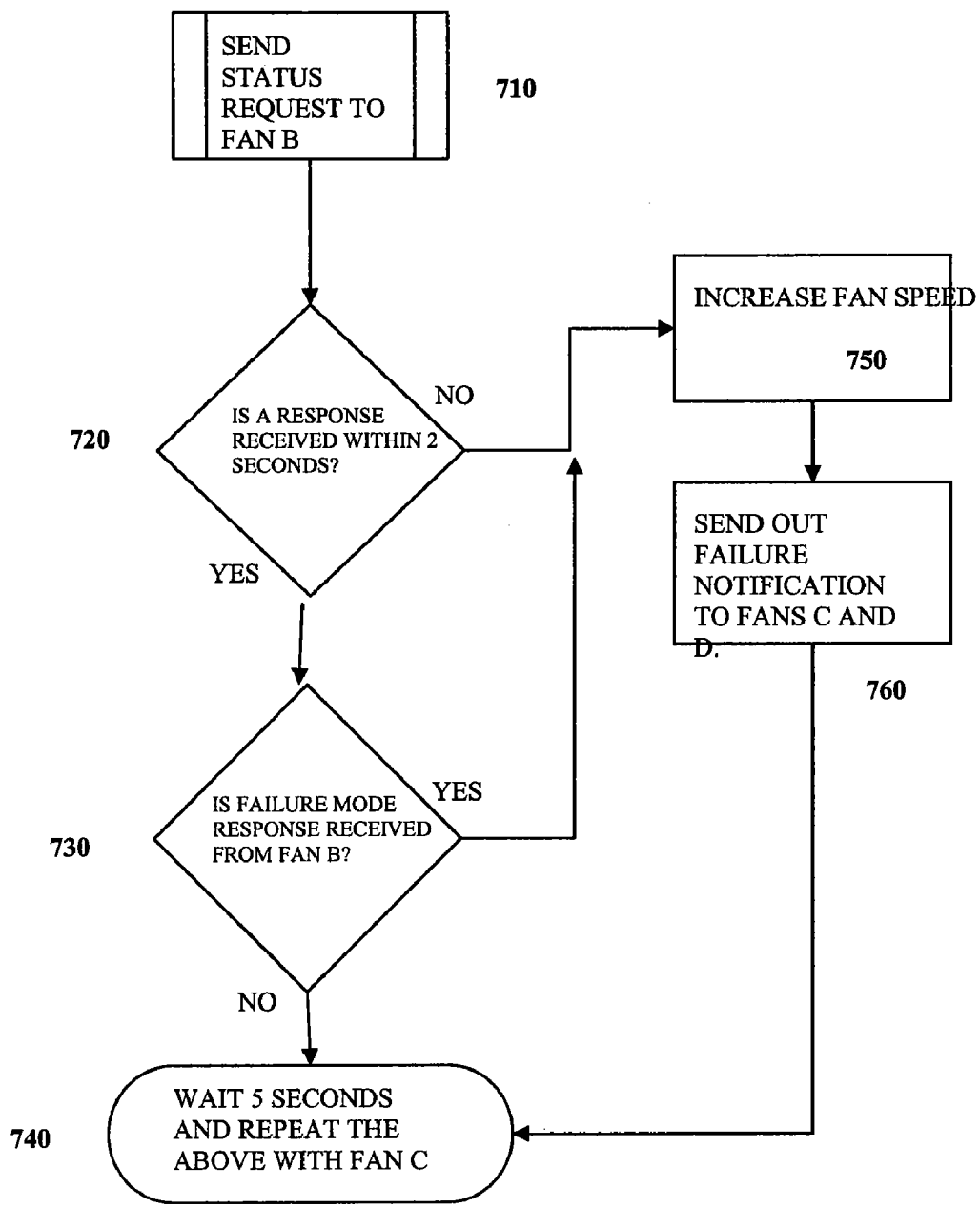
FIG. 7 illustrates a flow chart diagram of a logic path for a cooling fan according to an embodiment of the present invention.

FIG. 7 illustrates a flow chart diagram of a logic path for a cooling fan according to an embodiment of the present invention. FIG. 7 illustrates a failure detect process from the perspective of Fan A in a system having four fans, Fans A-D. According to an embodiment of the present invention, each of the Fans A-D have a parallel connection to an Inter-IC (I2C) bus. Initially, Fan A sends 710 a status request to Fan B. It is determined whether a response is received 720 by Fan A from Fan B within a predetermined period of time, e.g., 2 seconds. If a response is received, it is determined whether a failure mode response was received 730. If a failure mode response is not received, Fan A waits for a predetermined period of time, e.g., 5 seconds, then repeats 740 the above iteration with Fan C. If no response is received by Fan A from Fan B within the predetermined period of time (e.g., 2 seconds), or if a failure mode response is received by Fan A from Fan B, then the assumption is that Fan B has failed (or is failing) and Fan A proceeds to increase 750 its fan speed based on the cooling solution specifications/operating parameters and programming determined using the fan controller user interface software 500, a failure notification regarding Fan B's failure is transmitted 760 by Fan A, and Fan A waits for a predetermined period of time, e.g., 5 seconds, then repeats 740 the above iteration with Fan C. Once the iteration with Fan C is completed, the iteration is also performed with respect to Fan D.

Figure 8:
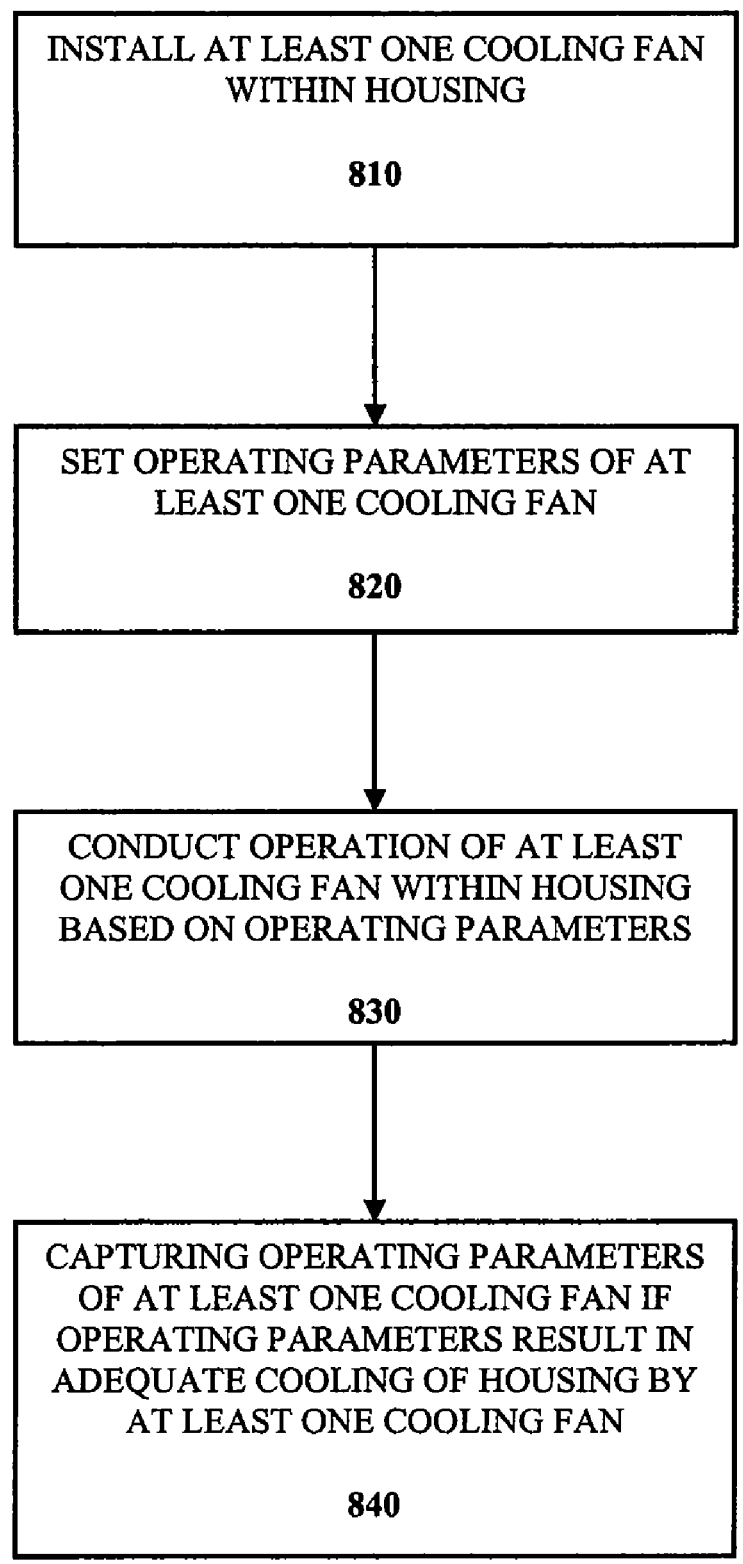
FIG. 8 illustrates a flow chart diagram of determining cooling solution specifications for an electronic system using a cooling fan according to an embodiment of the present invention.

FIG. 8 illustrates a flow chart diagram of determining cooling solution specifications for an electronic system using a cooling fan according to an embodiment of the present invention. At least one cooling fan is installed 810 within a housing. Operating parameters are set 820 for the at least one cooling fan. Operation of the at least one cooling fan within the housing is conducted 830 based on the operating parameters set. The operating parameters of the at least one cooling fan are captured 840 if the operating parameters result in adequate cooling within the housing by the at least one cooling fan.

Once the user has made the appropriate configurations for the behavior for each fan 510, 520, 530, 540 and is satisfied with the functionality of the fans 510, 520, 530, 540 installed in the cabinet/housing, the user may "freeze" the design and store the cooling solution specifications or operating parameters determined (e.g., each fan's RPM settings, alarms, conditions, temperature conditions, conditional behaviors (e.g., to compensate for a fan failure, temperature increase), etc., for that particular cabinet/housing). The cooling solution specifications may be forwarded to a cooling fan manufacturer, and specific cooling fans adhering to the customized cooling solution specifications may be manufactured, including the appropriate programming desired by the engineer set forth during the testing with the fan controller user interface software 500, and provided to the design engineer, knowing already that the cooling solution utilizing cooling fans with these characteristics and programming logic have already been tested and proven.

By utilizing the fan controller user interface software 500 according to an embodiment of the present invention, the thermal design engineer saves a significant amount of time in the design cycle by eliminating the need to design and build a specialized PCA or controller card for controlling the speeds and alarm settings of the cooling fan(s) 510, 520, 530, 540, and eliminating the iteration of asking for a fan sample, trying the fan out in the system, asking for a second higher-powered fan sample, trying the fan out in the system, etc., to determine a suitable cooling solution for a cabinet/housing. The thermal design engineer is able to balance airflow, noise, redundancy, and temperature response utilizing the fan controller user interface software 500 without having to go through an iterative process.

Figure 9:
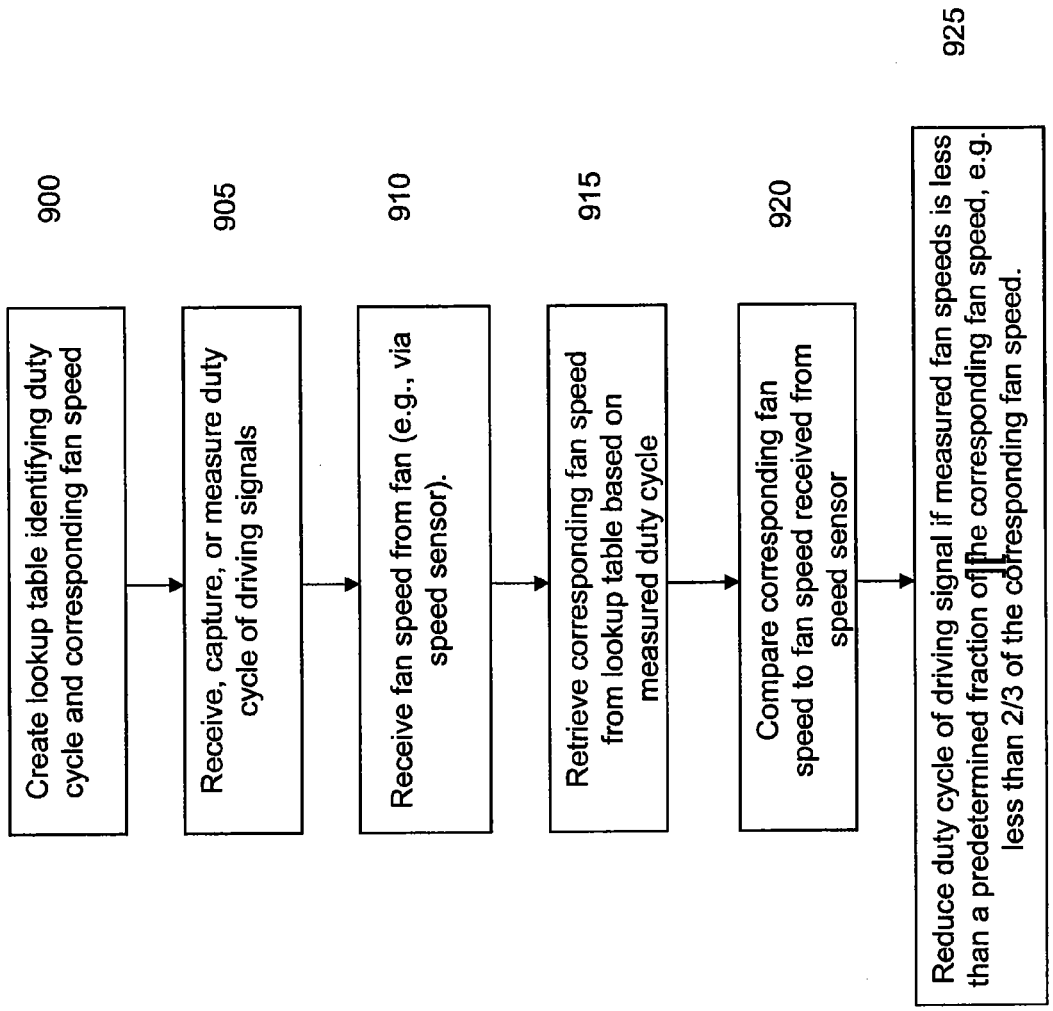
FIG. 9 illustrates a method of emulating an analog current limit function according to an embodiment of the present invention.

FIG. 9 illustrates a method of emulating an analog current limit function according to an embodiment of the present invention. In cooling fans, a small resistor may be added in series with a current of the motor to monitor the current of the motor. While effective, this approach has three drawbacks. First, the physical size of the resistor may be large, which can cause a problem fitting the resistor into a limited size of a typical fan motor hub. Second, this physically large resistor is much more expensive than standard resistors, which increases the motor cost. Third, the power dissipated by the large resistor reduces the overall motor efficiency.

In an embodiment of the invention, microcontroller software or program code may mimic this function. A lookup table may be created 900 that identifies a number of duty cycle measurements and corresponding fan speeds for the duty cycle measurements. In an alternative embodiment of the invention, a lookup table could include a number of DC voltage levels and corresponding fan speeds. For example, the lookup table may include an entry that 2.5 volts DC represents 2000 revolutions per minute. In an alternative embodiment of the invention, the lookup table could include a resistance received or sensed at the microcontroller and corresponding fan speeds. For example, the lookup table may include an entry that that 10,000 Ohms represents 2000 revolutions per minute. In this case, the microcontroller provides a current through the resistance and generates a DC voltage. This table may be created in a non-volatile memory. For example, the table may include the following entries. Still in regard to step 900, illustratively, the DC_array (Duty Cycle) table column illustrated below includes 101 entries which correspond to the 101 entries in the speed array table column.

DC_array[101]={0,10,20,31,41,51,61,72,82,92,102, 113,123,133,143,154,164,174, 184,195,205,215, 225,236,246,256,266,276,287,297,307,317,328, 338,348,358,369,379,389, 399,410,420,430,440, 451,461,471,481,492,502,512,522,532,543,553, 563,573,584,594,604, 614,625,635,645,655,666, 676,686,696,707,717,727,737,748,758,768,778, 788,799,809,819, 829,840,850,860,870,881,891, 901,911,922,932,942,952,963,973,983,993,1004, 1014,1024};

Speed_array[101]={7500,7177,6881,6608,6356,6122, 5906,5703,5515,5338,5172,5017, 4870,4732, 4601,4478,4360,4249,4144,4043,3947,3856, 3769,3686,3606,3529,3456,3386,3319, 3254, 3191,3132,3074,3018,2964,2913,2863,2814, 2768,2722,2679,2636,2595,2555,2517,2479, 2443,2408,2373,2340,2308,2276,2246,2216, 2187,2158,2131,2104,2078,2052,2027,2003, 1979, 1956,1933,1911,1889,1868,1847,1827, 1807,1788,1769,1750,1732,1714,16,1680,1663, 1647, 1630,1615,1599,1584,1569,1554,1540, 1526,1512,1499,1485,1472,1459,1446,1434, 1420,1410, 1398,1386,1375,1364};

In the table illustrated above, the DC_array value may represent a duty cycle of a pulse width modulated signal that is transmitted to the cooling fan. In an embodiment of the invention, the pulse width modulated signal's duty cycle can be integrated utilizing a series resistor and a parallel capacitor and turned into a DC voltage. In an embodiment of the invention, the DC voltage is input into a microcontroller analog to digital converter and converted into a digital value. In an embodiment of the invention, the DC voltage is input into an analog-to-digital converter external to the microcontroller and converted to a digital value. In the embodiment illustrated above, the digital value, i.e., the DC_array value, may be between 1 and 1024, which may be represented by 10 bits.

A Speed_array value is the speed target associated with or corresponding to the DC_array value. Illustratively, the maximum speed in the table or the array of speed_array values may be 7500 revolutions per minute (RPM). According to the table above, this corresponds to a zero voltage (digital value of 0) reading on the analog-digital (AD) pin of the microcontroller 1020. According to the table above, the minimum speed of the speed_array is 1364 RPM, which corresponds to a 5 volt reading on the AD pin of the microcontroller 1020 (digital value of 1024). In the embodiment illustrated above, the A/D converter in the microcontroller is a 10 bit value.

Figure 10:
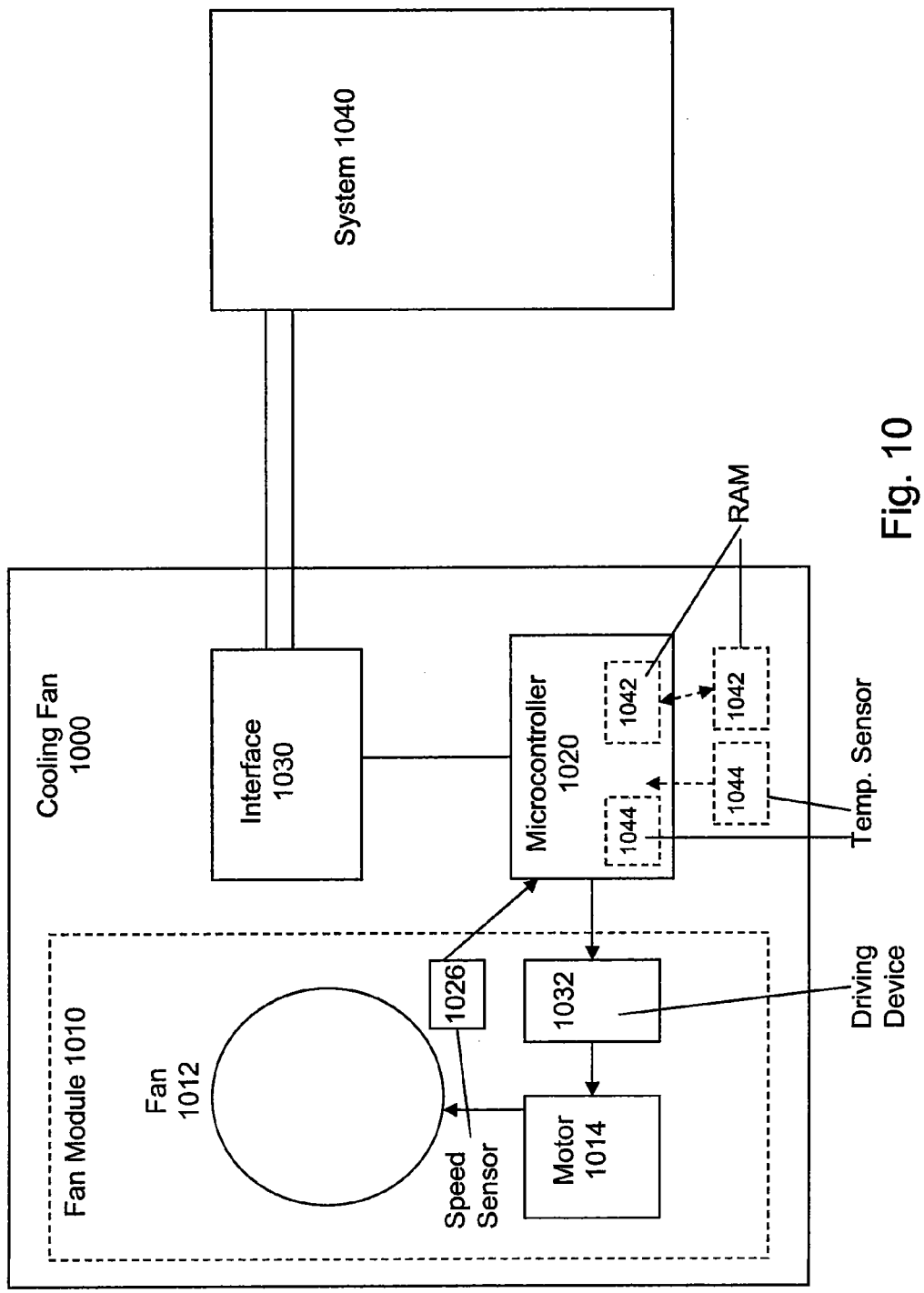
FIG. 10 illustrates a cooling fan including the analog current emulation function according to an embodiment of the present invention.

FIG. 10 illustrates a cooling fan including the analog current emulation function according to an embodiment of the present invention. The non-volatile memory 1042 may be physically located in the microcontroller 1020. Alternatively, the non-volatile memory 1042 may be physically located in the cooling fan 1000.

The microcontroller 1020 may measure 905 a duty cycle of a signal that is sent to drive the fan. As discussed above, this may be a pulse width modulated fan signal which is input into a A/D pin on the microcontroller 1020.

The microcontroller 1020 may receive 910 a speed measurement from the speed sensor 1026. The speed sensor 1026 may be a hall sensor or a back emf sensor. The speed sensor 1026 may magnetically sense the speed of the fan and may transmit a digital or analog signal to the microcontroller 1020.

The microcontroller 1020 may retrieve 915 a corresponding fan speed from the lookup table based on measured duty cycle in step 905 (or based on the duty cycle measured in step 905). In other words, the microcontroller 1020 may include software or program code to utilize the measured or captured duty cycle and to retrieve, from the non-volatile memory 1042, the corresponding or expected fan speed. As illustrated above, the microcontroller 1020 captures or measures the DC_array value and retrieves the corresponding or expected speed array value from the lookup table. Illustratively, the microcontroller 1020 may capture a duty cycle or DC_array value of 82 and then retrieve the corresponding or expected speed_array value (speed value) of 5515.

The microcontroller 1020 may compare 920 the corresponding fan speed to the fan speed received from speed sensor 1026. In other words, the microcontroller 1020 is determining if the actual fan speed corresponds to what the desired or expected fan speed should be.

If the measured fan speed is less than a predetermined fraction of the corresponding or expected fan speed, this indicates that something is not operating properly, (i.e., is the current to motor 1014 is too high). In response to the measured fan speed being less than the predetermined fraction, the microcontroller 1020 may then reduce 925 the duty cycle of the driving signal to the motor 1014. In an embodiment of the present invention, if the measured fan speeds is less than $\frac{2}{3}$ of the corresponding or expected fan speed, then the microcontroller 1020 may reduce 925 the duty cycle of the driving signal. The microcontroller 1020 may also request that readings at measurement points in the cooling fan be captured and recorded in order to determine the cause of the why the current to the motor is too high.

Illustratively, a normal fan motor is designed to run at 10,000 RPMs. Due to a malfunction or an impediment in the cooling fan 1000, the revolutions per minute may be reduced to 6,000 RPM even thought the current that is being provided to the cooling fan is enough current to normally run the normal fan motor at 10,000 RPMs. The 6,000 RPM may be measured by the speed sensor 1026. Because the computer system 1040 or customer was transmitting a pulse width modulation signal instructing the motor 1014 and fan 1012 to be turned at 10,000 rpm, comparison between the measured fan speed and the corresponding or expected fan speed results in the measured fan speed being less than a predetermined fraction, in this case less than $\frac{2}{3}$. Illustratively, the microcontroller 1020 may reduce the duty cycle of the driving signal in a corresponding ratio, e.g., $\frac{2}{3}$ of the customer or computer transmitted duty cycle. The reduction of the duty cycle reduces the current draw of the motor 1014 to prevent the motor 1014 from drawing in to much current and damaging components within the motor.

In an embodiment of the invention, the microcontroller 1020 may periodically attempt to test if the malfunction has been resolved, e.g., the obstruction to the fan 1012 has been removed. The microcontroller 1020 may attempt to slightly increase the duty cycle by a predetermined number of RPMs, e.g., increase a duty cycle of the driving signal by a value corresponding to 100 RPMs. After the duty cycle has been increased, the speed sensor measures or captures the speed of the motor 1014. If the speed of the motor 1014 does not increase, the microcontroller 1020 reduces the duty cycle by the predetermined number of RPMs and waits again for a predetermined time. Illustratively, the predetermined time may be 100 milliseconds. If the speed of the motor increases by the expected predetermined number of RPMs, e.g., 100

RPMs, the microcontroller 1020 increases the duty cycle to the increase the motor speed to the normal operating speed, e.g., 10,000 RPMs.

In a second embodiment of the invention, the normal operating speed of the motor/cooling fan may be a speed such as 10,000 RPMs. The speed sensor may measure that the motor speed has been reduced to 6000 RPMs. The microcontroller 1020 may shut down the driving signal to the motor 1014, i.e., the motor is shut off completely. The microcontroller 1020 waits a predetermined amount of time, e.g., 3 seconds, and transmits a driving signal to restart the cooling fan 1000. The driving signal includes a duty cycle which causes the motor to begin operating at 10,000 RPMs. There is a time it takes the motor 1014 to increase its operating speed to the 10,000 RPM operating speed. After this time, if the motor does not rotate at 10,000 RPMs, as measured by the speed sensor 1026, the driving signal to the motor is not transmitted, e.g., shut off. This process continues until the malfunction is corrected, e.g., the obstruction is cleared. Once the malfunction is corrected, the motor 1014 operates at full speed.

Figure 11:
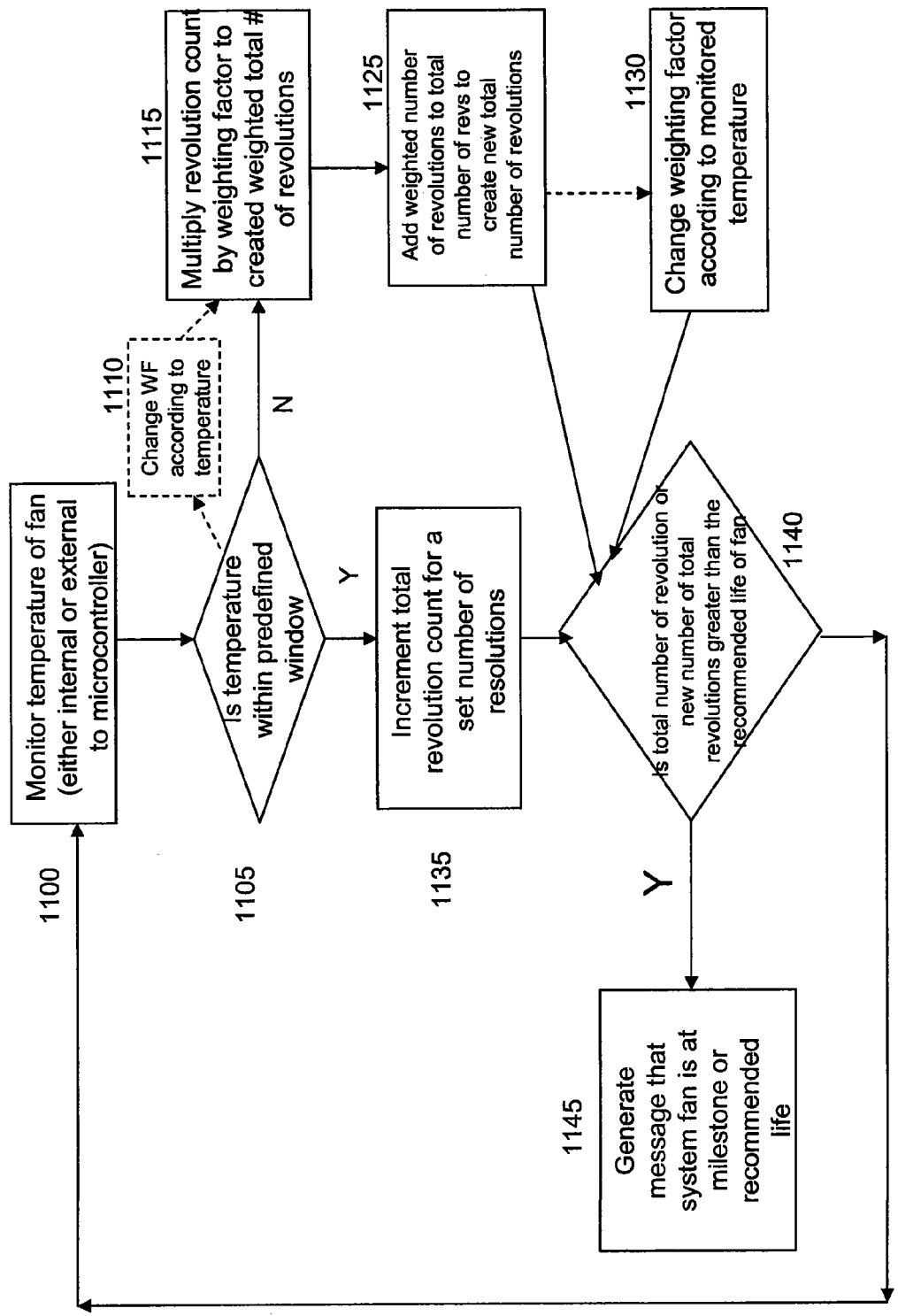
FIG. 11 illustrates a method of predicting a life of a cooling fan utilizing a weighting factor according to an embodiment of the present invention.

FIG. 11 illustrates a method of predicting a life of a cooling fan utilizing a weighting factor according to an embodiment of the present invention. During operation of the cooling fan, a temperature may be monitored 1100 utilizing a temperature sensor 1044, e.g., a temperature measurement may be captured. In an embodiment of the invention, a temperature sensor 1044 may be internal to a microcontroller 1020. In an embodiment of the invention, the temperature sensor may be external to the microcontroller 1020. Under certain operating conditions, the temperature may be monitored on a continuous basis. Under other operating conditions, the temperature may be monitored on a periodic basis, such as every 15 minutes, during the time the computer system 1040 or electronic device is powered on.

The monitored or measured temperature may be analyzed to determine 1105 if the measured temperature is within a predefined temperature window or range, e.g., +/−5 degrees of the pre-defined temperature. Depending on the operating environment of the cooling fan 1000, the window temperature or range may be +/−5 degrees, +/−1 degree, +/−15 degrees or +/−10 degrees. For example, a computer located in an outside environment, such as an airport hanger or an automobile repair shop, may be subject to more extreme temperature changes, and thus the range of temperatures may be larger than the range of temperatures a computer system in an office is subjected to.

If the measured temperature is within the predefined temperature window, a total revolution count or a total number of revolutions (Revtotal) may be incremented 1135 by a set revolution value. Illustratively, the set revolution value may be 1 revolution. Illustratively, the set revolution value may be 1000 revolutions, 10,000 revolutions, or 50,000 revolutions. Under certain operating conditions, the set revolution value may be based on a number of actual revolutions that occur in a temperature monitoring period. For example, if the temperature is monitored every fifteen minutes and the actual number of revolutions that normally occur in fifteen minutes is 150,000 revolutions, then the set revolution value may be 150,000 revolutions.

After the set number of revolutions is added to the total revolution count or total number of revolutions (Revtotal), Revtotal is compared 1140 to the recommended revolution life (e.g., Revlife) of the cooling fan or a milestone revolution target of the cooling fan. For example, if the set number of revolutions is 15K, Revtotal was 2,000,000 revolutions, and Revlife is 2,000,200 revolutions, then the recommended life of the cooling fan has been exceeded because the total number of revolutions is now 2,015,000 which is greater the recommended revolution life of 2,000,200 revolutions. The milestone revolution targets may be values that are points in number of revolutions during the life of a cooling fan 100 that a manufacturer or system integrator deem as important. For example, this may be 100K less than the recommended revolution life value or 50%, 70%, or 90% of the recommended revolution life value. Under these operating conditions, once a cooling fan 1000 reaches the defined revolution milestone, specific actions may occur.

If the total revolution count or total number of revolutions, (Revtotal), is greater than the recommended life or milestone target, then a message is generated 1145. Under certain operating conditions the message is transmitted to the computer system. Under other operating conditions, the message is stored in a non-volatile memory in the cooling fan 1000. Illustratively, when a message is transmitted, if Revtotal is greater than the recommended life of the cooling fan, then a message may be generated and transmitted to the computer system 1040 indicating that the cooling fan 1000 is past its recommended life and should be replaced immediately. In an embodiment of the invention, this may also result in a shutdown operation being initiated for the cooling fan 1000.

If Revtotal is greater than one of the revolution milestone targets, then a message may be generated identifying that a cooling fan 1000 has, for example, passed 70% of its life or is 100,000 revolutions away from the recommended life revolution number and that a new cooling fan 1000 should be ordered or procured in order to minimize downtime or degradation of the computer system. Any milestone target may be utilized including a milestone target that is 70% of the recommended revolution life of the cooling fan 1000. Under certain operating conditions, the generate message may be stored in a non-volatile memory for later analysis or under other operating conditions may be transferred to an external system (or computing device).

Under certain operating conditions, a milestone revolution target may be established at 70% and 90% of the recommended revolution life. The system may be set to generate messages once the total number of revolutions (total revolution count) of the cooling fan reaches 70% of the recommended revolution life of the fan, 90% of the recommended revolution life of the fan, and at the recommended revolution life of the fan. At 70%, the message may be a message indicating that the cooling fan is approaching the end of its life. At 90%, the message may be a little more urgent, and may instruct the system operator to be prepared for the cooling fan 1000 to fail. At the recommended revolution life of the cooling fan, the system 1040 may receive a message that the cooling fan 1000 has exceeded its life and should be replaced immediately.

If the total revolution count or total number of revolutions is not greater than the recommended revolution life or one of the milestone revolution targets, then the monitoring of the temperature, e.g., step 1100 continues to occur.

FIG. 11 also illustrates operating conditions if the temperature is outside the normal operating range. In an embodiment of invention, if the temperature is not within a predefined window or range, then a weighting factor may be changed 1110. The weighting factor is a factor that is multiplied by a number of revolutions in order to compensate for the increase in temperature. In other words, a fan running at 30 degree Celsius temperature with 100,000 revolutions experiences the same wear and tear as a fan running at 45 degree Celsius temperature with 80,000 revolutions, and the weighting factor compensates for this. A higher temperature leads to a fan not operating in as efficient a matter as one operating at a lower temperature.

An example weighting factor table and associated temperature table is listed below. In this embodiment of the invention, the standard operating temperature of the cooling fan is 25 degrees Celsius. The table illustrates the increase in weighting factor as the temperature increases in the cooling fan.

| Temperature | Weighting Factor |
|---|---|
| 25° C. | 1 |
| 35° C. | 1.5 |
| 45° C. | 2.7 |
| 55° C. | 4.3 |
| 65° C. | 6.4 |
| 70° C. | 10 |

In this embodiment of the invention, the set number of revolutions is multiplied 1115 by the temperature based weighting factor to compensate for the higher or lower operating temperature. As discussed above, the set number of revolutions may represent the number of revolutions that occur during a monitoring period. For example, if the weighting factor is 1.25 and the set number of revolutions is 1,000, then the weighted revolution total is 1,250 revolutions. Illustratively, if the temperature is 55° C., the weighting factor is 4.3 and the weighted revolution total is 4,300.

The weighted revolution total is added 1125 to the total number of revolutions (Revtotal) to create a temperature adjusted total number of revolutions. For example, if the total number of revolutions is 1,000,000 and the weighted revolution total is 500,000 (equal to the weighting factor of 5×100, 000 revolutions), then the new total number of revolutions is 1,500,000 even though the actual number of total fan revolutions is only 1,100,000.

The new total number of revolutions, e.g., the temperature adjusted number of revolutions, is compared 1140 to the recommended life number revolutions of the cooling fan or milestone revolution targets. If the temperature adjusted number of revolutions is greater than one of the milestone revolution targets and/or the recommended life number of revolutions of the cooling fan 1000, then a message is generated 1145 by the computer system indicating that the milestone revolution target or recommended life number of revolutions has been passed. If the temperature adjusted number of revolutions is less than the milestone target or the recommended life revolution of the cooling fan, then the temperature of the cooling fan is monitored again (step 1100) after a designated monitoring period.

Under certain operating conditions, the weighting factor is not calculated until after the temperature adjust number of revolutions is compared to the recommended life revolution or milestone target revolutions of the cooling fan. This is illustrated by reference numeral 1130 of FIG. 11. In this example, the weighted factor utilized for multiplying the revolution count is not the most recently measured temperature; instead it is the previously measured temperature. This may be utilized in situations where the weighting factor is to reflect a past temperature value of the cooling fan since the past temperature may have lead to degredation of the operation of the cooling fan 1000. In this embodiment of the invention, the weighting factor is not changed according to the monitored temperature immediately after it is determined whether the monitored temperature is in a predefined window, as it was in step 1110.

The table below illustrates three increments of the flowchart of FIG. 11. Each monitoring period, e.g., 30 minutes, is represented by 10,000 revolutions (10K revolutions occur each 30 minutes). The temperature for the first rotation is 25 degrees, which is the standard operating temperature. Thus, the temperature is within the first predefined temperature window. Since the total revolution count was zero, the total revolution count is now equal to 10,000. The recommended revolution life of the cooling fan is 1,000,000 revolutions, so no message is generated. During a succeeding monitoring period, the temperature of the fan is measured to be 35 degrees. The temperature is no longer within the predefined window because the predefined window is +5 degrees outside the range, if the range was +/−5 degrees. The weighting factor table is consulted and a factor of 1.5 is retrieved for 35 degrees. The set number of revolutions, e.g., 10K, is multiplied by the weighting factor to create a weighted number of revolutions of 15K. The 15K revolutions is added to the previous total revolutions which results in a new total number of revolutions of 25K. Again, the new total number of revolutions is lower than the recommended life revolutions and no message is generated.

During a succeeding monitoring period, the temperature of the fan is measured to be 45 degrees. Because this temperature is outside of the predefined temperature range, a weighting factor table is consulted and a factor of 2.7 is retrieved for 45 degrees. The set number of revolutions is multiplied by the weighting factor to create a weighted number of revolutions of 27K. The weighted number of revolutions is added to the new total number of revolutions, e.g., 25K, and the new total number of revolutions is 42K. This is also not greater than the recommended life revolutions of the fan so no message is generated. It is important to note that although only 30K actual revolutions of the cooling fan have occurred, a temperature adjusted 42K revolutions is recorded for the cooling fan to more accurately reflect when the cooling fan may fail.

| Increment | Actual # of revolutions | Temperature | Weighting Factor | Weighted Number of Revolutions | New Total Number of Revolutions |
|---|---|---|---|---|---|
| 1 | 10,000 | 25 | 1.0 | 10,000 | 10,000 |
| 2 | 10,000 | 35 | 1.5 | 15,000 | 25,000 |
| 3 | 10,000 | 45 | 2.7 | 27,000 | 42,000 |
|   | 30,000 |   |   |   | 42,000 |

Figure 12:
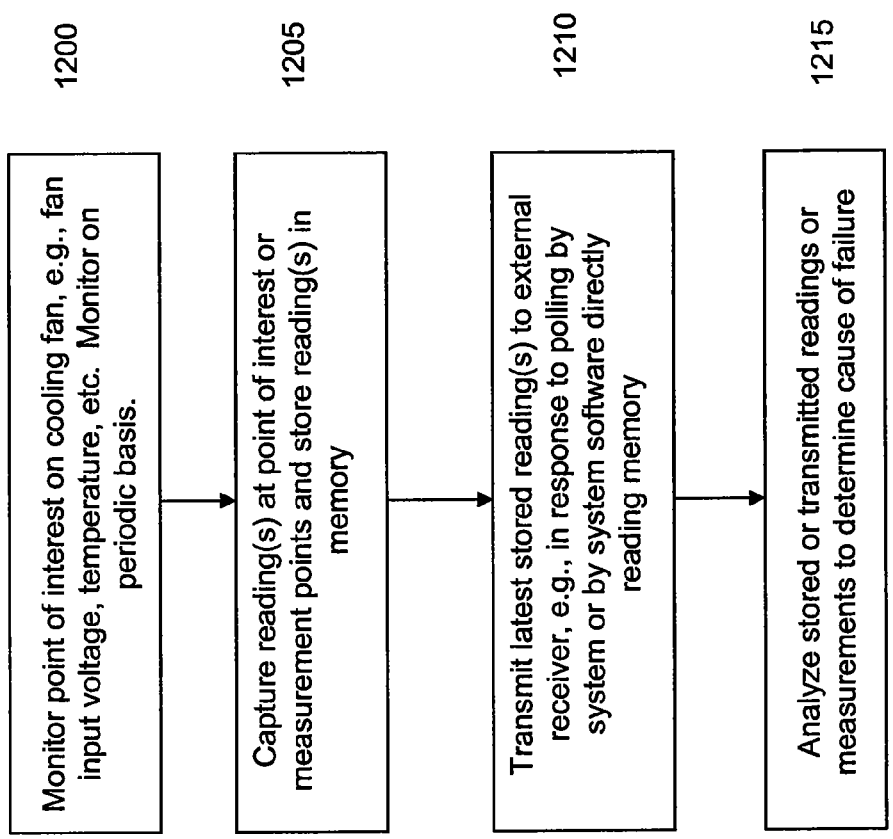
FIG. 12 illustrates a flowchart for analyzing operating points of interest or measurement points in a cooling fan according to an embodiment of the present invention.
Figure 14A:
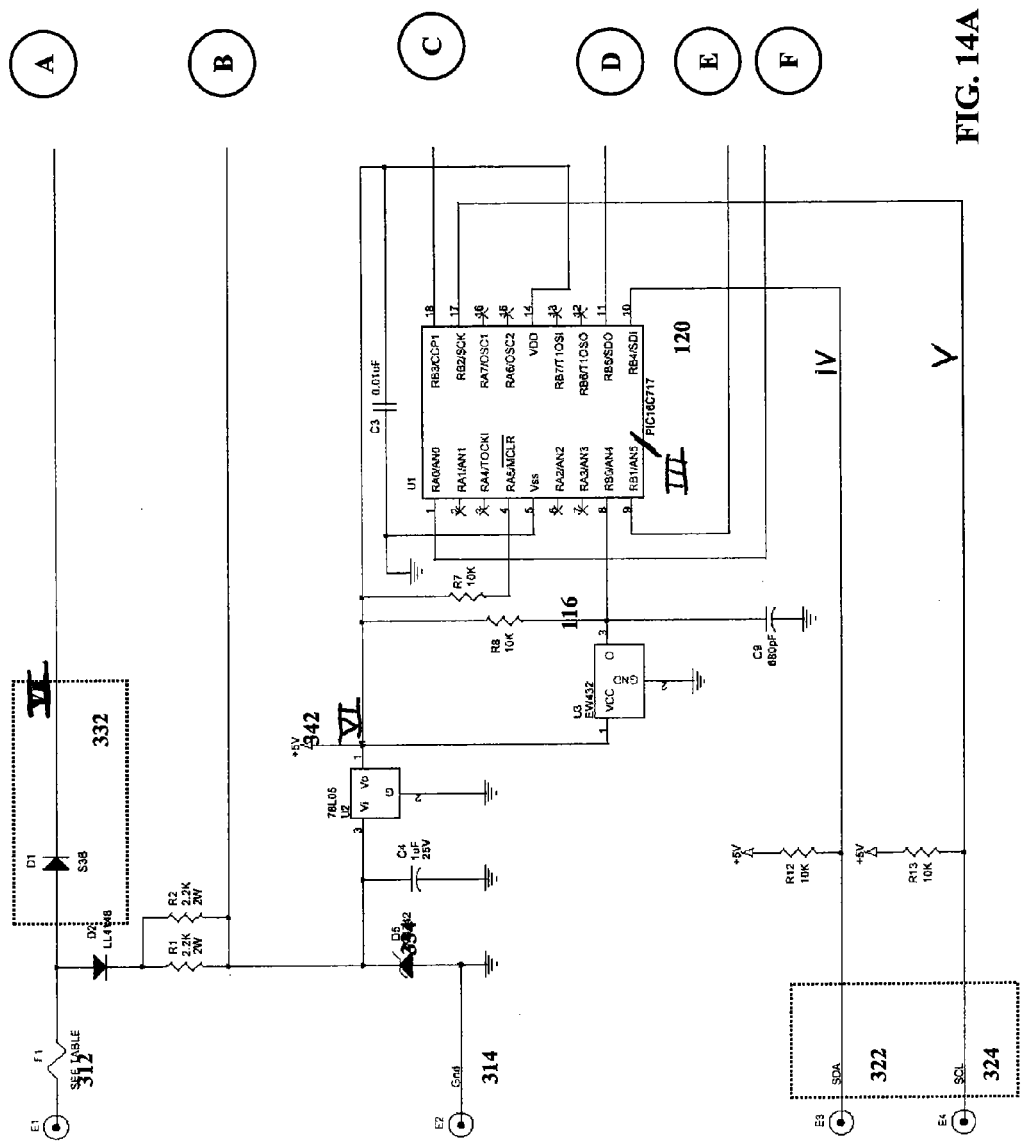
FIGS. 14A and 14B illustrate operating points of interest for an exemplary cooling fan according to an embodiment of the present invention.
Figure 14B:
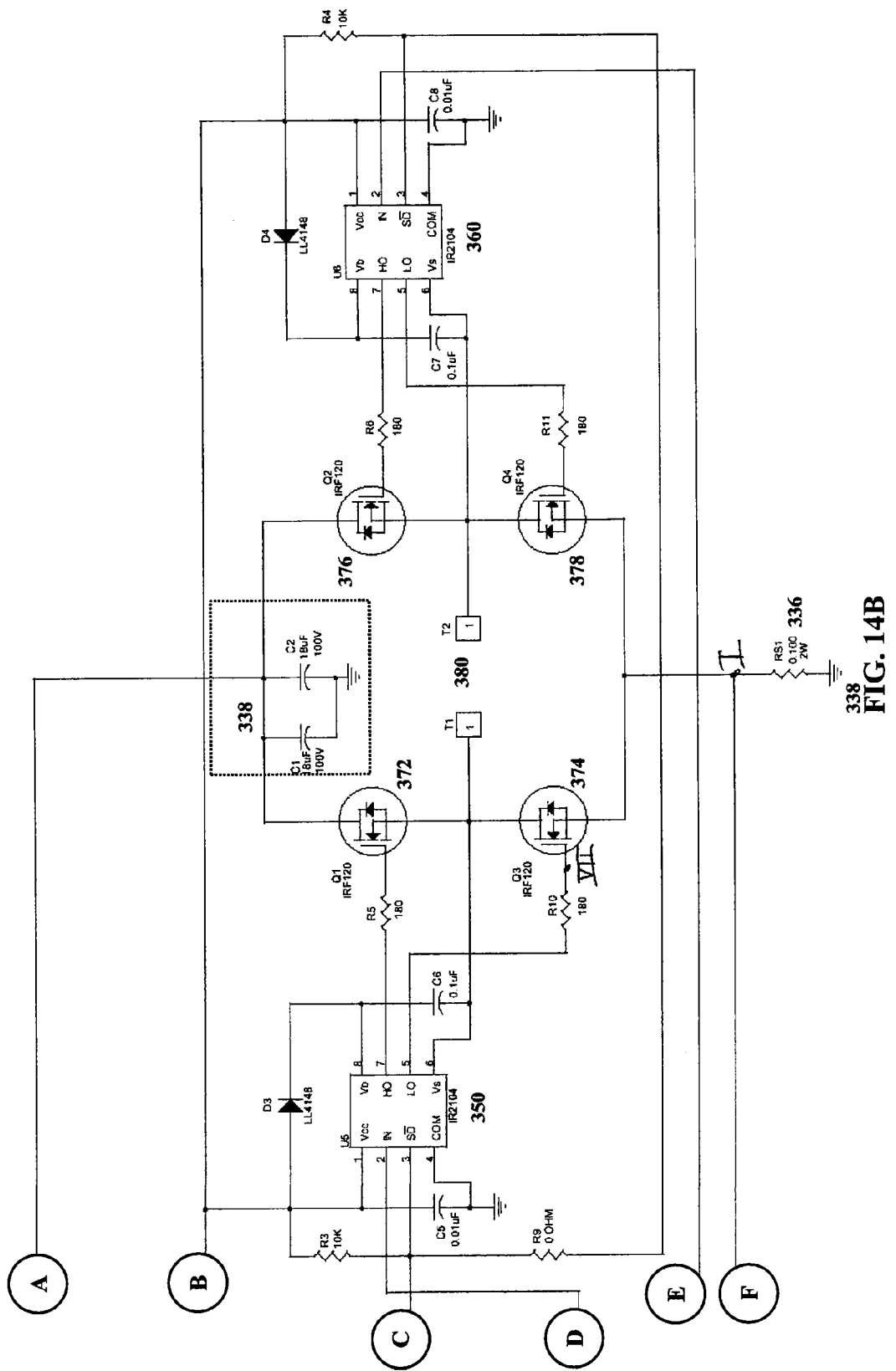

FIG. 12 illustrates a flowchart for analyzing operating points of interest or measurement points in a cooling fan according to an embodiment of the present invention. FIGS. 14A and 14B illustrate operating points of interest for an exemplary cooling fan according to an embodiment of the present invention. The table below identifies the operating points of interest for the cooling fan.

| Reference Numeral/ Identification Numeral | Measurement Of |
|---|---|
| I | Fan current |
| II | Fan input voltage |
| III | Microcontroller temperature measurement |
| 322 (IV) | Speed control input |

-continued

| Reference Numeral/ Identification Numeral | Measurement Of |
|---|---|
| 324 (V) | Tachometer alarm status |
| VI | Microcontroller input voltage |
| VII | MOSFET Input Voltage |

Referring to FIG. 12, operating points of interest (or measurement points) are monitored 1200 in the cooling fan 1000. In an embodiment of the invention, a microcontroller 1020, may receive inputs corresponding to the operating points of interest. For the analog inputs, the analog inputs may be received at the microcontroller 1020 by dividing down the analog signals to safe levels for the microcontroller by utilizing high resistance value resistors in a resistor divider circuit. In an embodiment of the invention, the analog signal is received by the microcontroller 1020 and converted to a digital signal by an Analog/Digital converter (ADC) inside the microcontroller 1020. The monitoring may occur on a periodic basis. Illustratively, the monitoring may occur every 1 microsecond, every second, or every 30 seconds.

The readings at the operating points of interest or measurement points may be captured and then stored 1205 in a memory in the cooling fan. As illustrated in FIG. 10, the memory 1042 may be a non-volatile memory such as a flash memory or an EEPROM. In an embodiment of the invention, the non-volatile memory 1042 may be internal to the microcontroller 1020. In an embodiment of the invention, the non-volatile memory 1044 may be external to the microcontroller but still located inside the cooling fan 1000.

In an embodiment of the invention, the captured readings at the operating points (measurement points) of interest may be transmitted 1210 to a receiver that is external to the cooling fan 1000. As illustrated in FIG. 10, the microcontroller 1020 in the cooling fan 1000 may transmit the measurements at the operating points of interest through the interface 1030 to a computer system 1040 utilizing a known communication protocol.

In an embodiment of the invention, the captured readings at the operating points of interest or measurement points may remain in the non-volatile memory 1042 of the cooling fan 1000 for a time period. The non-volatile memory 1042 may be large enough to accommodate a set number of readings of the operating points of interest or measurement points. For example, if seven measurements are taken in each measurement period, e.g., the seven measurements listed in the table above, the non-volatile memory 1042 may be large enough to store 20 repetitions of these seven measurements. Under other operating conditions, the non-volatile memory 1042 may record the readings at the operating points of interest or the measurement points for the last hour of the cooling fan operation. By storing a number of sets of captured measurements for each of the measurement points, the non-volatile memory 1042 may be utilized as a device that can be looked at to determine the cause of failure in the cooling fan 1000, e.g., like a black box in an airplane.

In an embodiment of the invention, the captured readings at the operating points of interest may be read or retrieved 1210 from the non-volatile memory on a periodic basis. In an embodiment of the invention, the captured readings at the measurements points may be transmitted to an external device or a computer system. The captured readings at the operating points or measurement points may be read each time the measurements are stored in the non-volatile memory 1042 or the measurements may be read at a specified timeframe, e.g., such as every 30 minutes. The measurements may be read utilizing the communication protocol of the system 1040 and by utilizing the interface 1030. The measurements may also be read by creating a separate input on the cooling fan which an external device may utilize to read or retrieve the captured readings. The external device may communicate with the cooling fan 1000 utilizing serial communications.

The captured readings at the operating points of interest/ measurement points are analyzed 1215 to assist in determining a cause of the failure of a cooling fan. Illustratively, if the cooling fan 1000 fails, the stored, transmitted, or read readings are analyzed to identify what may have caused the failure. Illustratively, the operating points of interest may include the fan current, the fan input voltage, a speed reading measurement and a MOSFET gate voltage. If the fan input voltage was outside a normal level, e.g., +45 percent of normal voltage, the data may indicate that the input voltage caused the failure of the cooling fan, and that the device that provides the fan input voltage may be malfunctioning.

In an embodiment of the invention, an operator of the system 1040 may view the measurements at the operating points of interest, either after the measurements are transmitted from the cooling fan or retrieved from the cooling fan. In this embodiment of the invention, the computer system may automatically analyze the measurements at the operating points of interest and may generate error messages or messages identifying the probable cause of the failure of the cooling fan.

Figure 13:
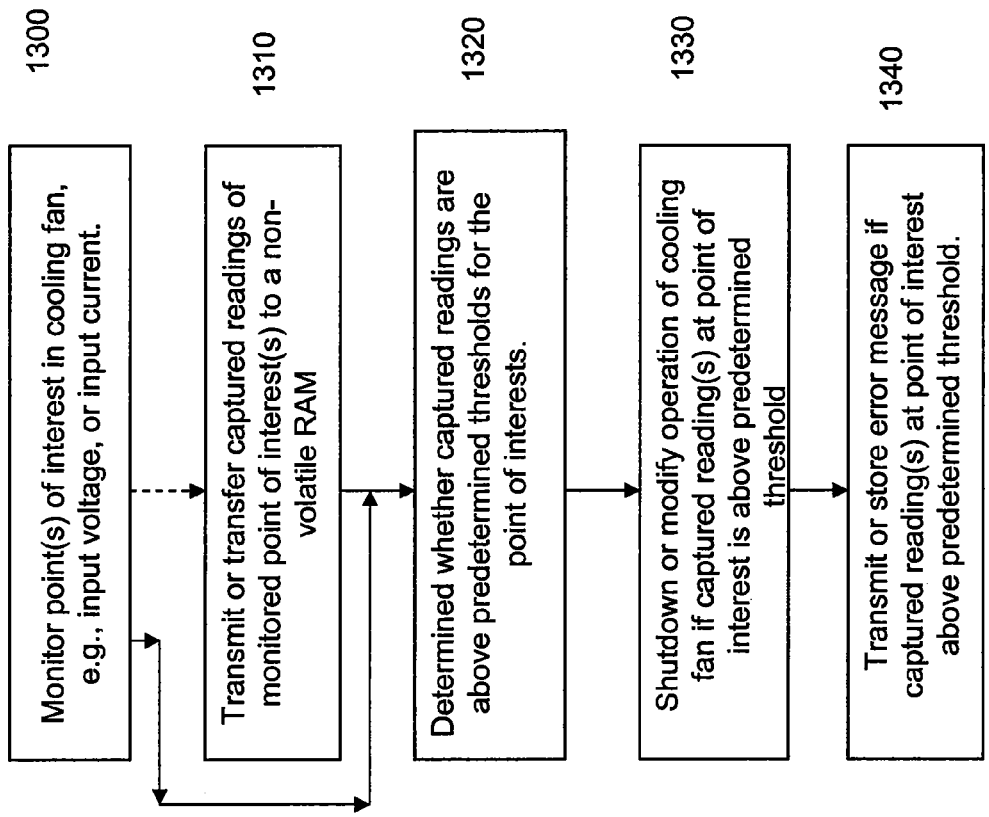
FIG. 13 illustrates a method of measuring points of interest in a cooling fan in order to keep a cooling fan from failing according to an embodiment of the present invention.

FIG. 13 illustrates a method of measuring points of interest in a cooling fan in order to keep a cooling fan from failing according to an embodiment of the present invention. As discussed above in regard to FIG. 12, points of interest are monitored 1300, such as cooling fan input voltage, cooling fan current, microcontroller input voltage, etc. The method prevents cooling fans from failing if unacceptable measurements are received from the operating points of interest.

In an embodiment of the present invention, the captured readings at the point of interests or measurement points may be transmitted 1310 to a non-volatile RAM or a volatile RAM for storage. For example, the input current measurement and the microcontroller input voltage may be transmitted to a non-volatile RAM for storage.

The cooling fan 1000 may store predetermined thresholds for measurements at the cooling fan points of interest in a non-volatile RAM 1024. The non-volatile RAM 1024 may be located internal to the microcontroller 1020 or external to the microcontroller 1020. The captured readings at the points of interest or measurement points are compared 1320 to the predetermined thresholds to determine if the captured readings exceed or are less than the predetermined thresholds. For example, the input voltage to the microcontroller may have a lower threshold of 4.6 volts and an upper threshold of 5.6 volts. If the measured input voltage for the cooling fan is 5.9 volts, then the measured input voltage exceeds the predetermined threshold.

If the captured readings at a cooling fan point of interest or measurement point is above one of the predetermine thresholds, then a shutdown operation or a modification operation may be initiated 1330 for the cooling fan. The shutdown operation may shutdown operation of the cooling fan by disabling the outputs of the microcontroller. The modification operation of the cooling fan may result in the increasing or the decreasing of a duty cycle of a driving signal transmitted to the motor 1014 from the microcontroller 1020.

Illustratively, 1) the input voltage to the cooling fan, 2) the fan speed, 3) the MOSFET driving voltage, and 4) the input voltage to the microcontroller may be monitored. Under certain operating conditions, the fan speed may be determined to be greater than the fan speed predetermined threshold, e.g., the fan is rotating too fast. A modification operation may be initiated via the microcontroller 1020 to reduce the duty cycle of the driving signal to the motor 1014. Under certain operating conditions, the input voltage to the microcontroller 1020 may be too high and may be higher than the microcontroller input voltage predetermined threshold. Because a high microcontroller input voltage may cause damage to the microcontroller 1020, a shutdown operation may be initiated to shutdown operation of the cooling fan 1000.

If the captured readings at one of the points of interest or measurement points is above a predetermined threshold, than an error message or message may be transmitted 1340 to the computer system that the error condition has occurred, that a modification operation was initiated, or that the cooling fan 1000 was shut down. In some cases, this information may be transmitted to a log file. Under other operating conditions, the error message or message may appear as a dialog box in the graphical user interface of the currently executing application.

The method described in FIGS. 9 and 13 may be incorporated together. In other words, in step 920 of FIG. 9, a corresponding fan speed for a reading (duty cycle value, DC voltage, resistance) may be compare to a fan speed received from the speed sensor. In addition to reducing the duty cycle (or other value) of a driving signal if the measured fan speed is less than a predetermined fraction of the corresponding fan speed, an error message may be generated identifying that the fan is not operating correctly. Under certain operating conditions, this error message may be stored in a memory in the cooling fan. Under other operating conditions, this error message may be transmitted to a computer system coupled to the cooling fan.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A method of controlling a motor speed for a fan assembly, comprising:
   receiving a duty cycle value at a microcontroller;
   operating a motor of the fan assembly with a motor drive signal having a duty cycle substantially equal to the received duty cycle value;
   receiving a measured fan speed from a speed sensor;
   determining an expected fan speed based on the duty cycle value, wherein the expected fan speed is an expected speed of the motor when the motor is driven by the motor driving signal;
   comparing the measured fan speed with the expected fan speed; and
   reducing the duty cycle of the motor driving signal if the measured fan speed is less than a predetermined fraction of the expected fan speed.

2. The method of claim 1, wherein the measured fan speed is received at the microcontroller.

3. The method of claim 1, wherein the expected fan speed is retrieved from a lookup table, the expected fan speed corresponding to the duty cycle value in the lookup table.

4. The method of claim 1, further including:
   waiting a predetermined amount of time; and
   increasing the duty cycle of the motor driving signal to a test duty cycle to determine if a motor driving the fan assembly is operating in a desired operating condition.

5. The method of claim 4, further including:
   calculating a second duty cycle value corresponding to the test duty cycle; receiving a second measured speed from the speed sensor;
   retrieving a second expected fan speed from the lookup table corresponding to the second duty; and
   comparing the second measured speed to the second expected fan speed.

6. The method of claim 5, further including reducing the duty cycle of the motor driving signal if the second measured speed is not within a range of the second expected fan speed.

7. The method of claim 5, further including increasing the duty cycle of the motor drive signal to a full operational value if the second measured speed is within a range of the second expected fan speed.

8. The method of claim 1, further including stopping transmission of the motor driving signal if the measured fan speed is less than a second predetermined fraction of the expected fan speed.

9. The method of claim 8, further including waiting a predetermined amount of time and transmitting the motor driving signal after the predetermined amount of time.

* * * * *